(12) United States Patent
Takeuchi et al.

(10) Patent No.: US 7,274,133 B2
(45) Date of Patent: Sep. 25, 2007

(54) CELL DRIVING TYPE PIEZOELECTRIC ACTUATOR, AND METHOD OF MANUFACTURING CELL DRIVING TYPE PIEZOELECTRIC ACTUATOR

(75) Inventors: Yukihisa Takeuchi, Nishikamo-Gun (JP); Koji Kimura, Nagoya (JP); Koichi Iwata, Kani (JP); Kazuhiro Yamamoto, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 221 days.

(21) Appl. No.: 10/855,932

(22) Filed: May 27, 2004

(65) Prior Publication Data

US 2004/0251785 A1 Dec. 16, 2004

(30) Foreign Application Priority Data

May 30, 2003 (JP) ............................. 2003-155009
Oct. 30, 2003 (JP) ............................. 2003-370594
May 25, 2004 (JP) ............................. 2004-154940

(51) Int. Cl.
*B41J 2/045* (2006.01)

(52) U.S. Cl. ...................... 310/365; 310/363; 310/364; 310/366; 310/324

(58) Field of Classification Search ................ 310/328, 310/323.02, 358, 359, 367, 311, 363–366; 347/68, 70–72
See application file for complete search history.

(56) References Cited

U.S. PATENT DOCUMENTS 6,223,405 B1* 5/2001 Oikawa et al. ............... 347/68
2002/0001021 A1* 1/2002 Tachibana ..................... 347/68

FOREIGN PATENT DOCUMENTS

| JP | 06-143564 A1 | 5/1994 |
| JP | 07-081055 | 3/1995 |
| JP | 3217006 B2 | 8/2001 |
| JP | 3465959 B2 | 8/2003 |

* cited by examiner

*Primary Examiner*—J. San Martin
(74) *Attorney, Agent, or Firm*—Burr & Brown

(57) ABSTRACT

A cell driving type piezoelectric actuator comprising: a plurality of cell driving bodies each comprising a wall portion, a cell formed by the wall portion, a piezoelectric body formed on at least one of wall portions and at least one pair of electrodes formed on the piezoelectric body; said piezoelectric operation portion being capable of changing a volume of the cell on which said piezoelectric operation portion is formed by its displacement, wherein the piezoelectric actuator comprises at least one pair of support bodies, the plurality of cell driving bodies are formed completely independent of one another and are connected to one another through at least one pair of support bodies, and the cell driving bodies and the support bodies are integrally formed by firing a green body of said piezoelectric actuator. A method for manufacturing the same is also disclosed.

8 Claims, 10 Drawing Sheets

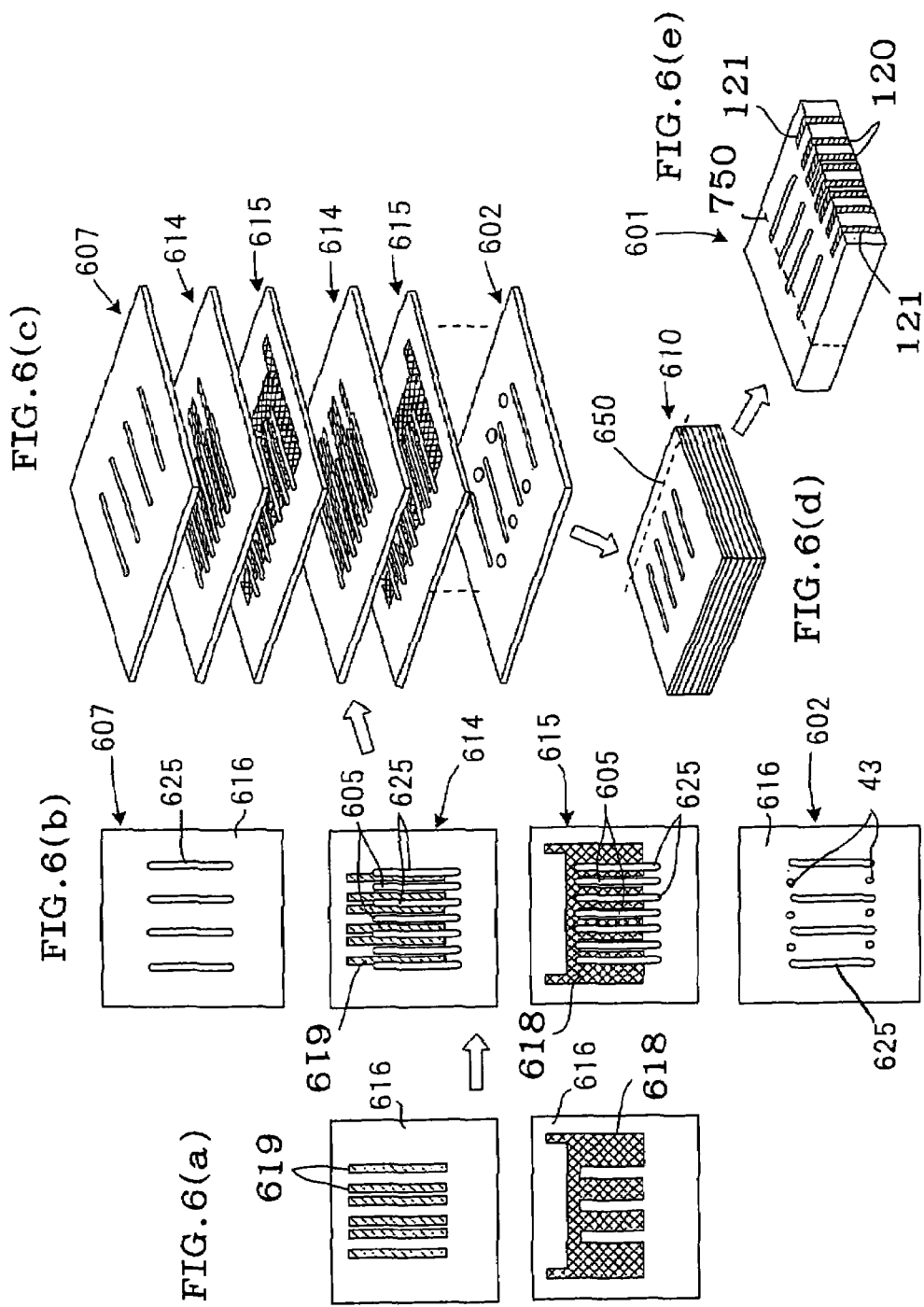

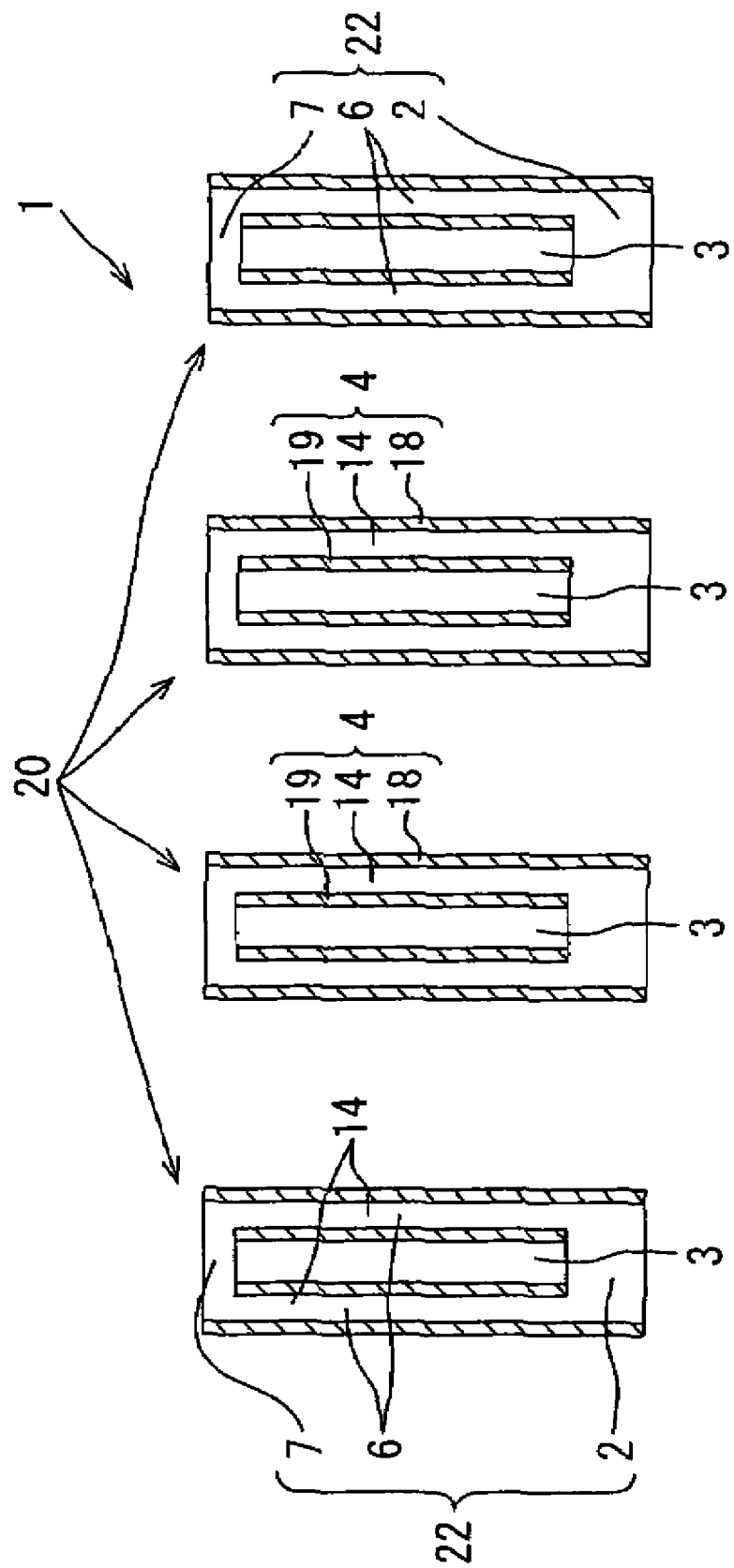

CELL DRIVING TYPE PIEZOELECTRIC ACTUATOR, AND METHOD OF MANUFACTURING CELL DRIVING TYPE PIEZOELECTRIC ACTUATOR

This application claims the benefit of Japanese Application 2003-155009, filed May 30, 2003, Japanese Application 2003-370594, filed Oct. 30, 2003, and Japanese Application 2004-154940, filed May 25, 2004, the entireties of which are incorporated herein by reference.

BACKGROUND OF THE INVENTION

1. Field of the Invention

The present invention relates to a cell driving type piezoelectric actuator comprising a plurality of cells each being defined by wall portions, and capable of achieving a predetermined function due to the volume change of the cell(s) by displacement caused by a piezoelectric operative portion provided on the wall portions.

2. Description of the Related Art

It has passed a long time since an ink jet head was employed for a printer, facsimile machine, copying machine, and other printing apparatuses. In recent years, a non-impact system has been used especially in most of small-sized printers, and a clear image has been reproduced on paper by the sophisticated ink jet head as in a silver salt photograph.

A printing apparatus of the non-impact system means an apparatus for printing by discharging an ink via a nozzle to print some images and/or characters to be printed on a printing medium (mainly paper). They are classified mainly into a piezoelectric system and a thermal jet system (Bubble Jet (registered trademark), etc.), depending upon type of the ink jet head discharging an ink. In these systems, the piezoelectric system denotes a printing apparatus in which a piezoelectric actuator is used as an ink jet head. This ink jet head mainly comprises a nozzle, an ink chamber communicating with an ink supply path, and a piezoelectric device capable of causing a volume change in the ink chamber. In the printing apparatus of the piezoelectric system, the ink jet head carries out typing or printing by causing the volume change in the ink chamber while applying a driving voltage to the piezoelectric device to discharge an ink from the nozzle onto a printing medium. Since the ink jet head of the piezoelectric system is not required to heat an ink like the thermal jet system, this type of the printing head has such advantages that the freedom in the selection of the ink is high, and that the controllability of the printing performance is excellent.

On the other hand, there has been a limitless demand for realization of a clearer and faster printing apparatus, and the ink jet head of the piezoelectric system has also been requested to further enhance an ink discharge power and an arrangement density of the piezoelectric device and ink chamber. Therefore, many proposals have heretofore been made to meet these requests. For example, an ink jet head having a high discharge power has been disclosed in the Patent Document 1 (See JP-A-6-143564). As shown in FIG. 1 of this Document, the ink jet head disclosed therein comprises plural number of chambers wherein every other chamber (channel) mutually separated by fine piezoelectric splits is filled with an ink to form an ink chamber (ink channel), and wherein a dummy chamber (dummy channel) is disposed between the ink chambers. An ink in the ink chamber is discharged through a nozzle by deforming the fine piezoelectric splits on both sides of the ink chamber by a contraction/expansion mode. In the ink jet head, the fine piezoelectric splits are polarized toward the individual chambers, an electrode is formed on at least the surface facing to the individual chamber (side surface) of each fine piezoelectric splits so as to constitute a piezoelectric device, and a driving voltage having a polarity in accordance with the polarized direction of the fine piezoelectric splits is applied to each electrode of the fine piezoelectric splits on the both sides of the ink chamber so as to displace the fine piezoelectric splits, and the ink chamber is contracted/expanded to change the volume of the chamber as a result, thereby an ink is discharged. When the height of the fine piezoelectric split is increased, the volume change of the ink chamber is increased without raising the driving voltage or increasing a width of the fine piezoelectric fine split which would result in lowering of the arrangement density, and the ink discharge power is enhanced.

Further Patent Document 2 (See Japanese Patent No. 3217006) has disclosed an ink jet (recording) head capable of solving problems of the ink discharge power and crosstalk. As shown in FIG. 1 of this Patent Specification, the proposed ink jet head is a one wherein the electrode coated with a protector layer is disposed on the inner surface of a piezoelectric substrate (plate) to form a groove covered with a lid (top plate) on an upper side. The ink chamber (ink channel) charged with the ink or the dummy chamber (dummy channel) are formed every other groove, and a nozzle plate including the nozzle communicating with the ink chamber is disposed. The both side walls of piezoelectric body defining the ink chamber i.e., the piezoelectric devices wherein the electrode is formed are displaced and deformed to discharge the ink from the nozzle in the ink jet head. For the ink jet head, the lid includes a slit extending through the nozzle plate above the dummy chamber, a depth of the dummy chamber is larger than that of the ink chamber, and the dummy chamber has a depth to such an extent that slip deformation of a bottom part of the dummy chamber is not caused by the deformation of the piezoelectric side walls constituting the ink chamber. Therefore, the crosstalk is reduced.

However, the above-described conventional ink jet heads are supposed to have several problems. For the ink jet head of Patent Document 1, a first problem is generation of crosstalk. As shown in FIG. 1 of Patent Document 1, since all the fine piezoelectric splits are bound by the upper lid and lower insulating support substrate in the described ink jet head, the contraction/expansion of one fine piezoelectric split would cause the deformation of another fine piezoelectric split through the lid and insulating support substrate, and the crosstalk is supposed to be generated. As a result, a diameter of an ink droplet discharged from the ink chamber or a discharge speed becomes nonuniform, and enhancement of quality of typing/printing is possibly limited.

Moreover, a embodiment in which all the fine piezoelectric splits are bound by the upper lid and lower insulating support substrate is a factor which obstructs the displacement of the fine piezoelectric splits defining the ink chamber. This results in a second problem that the enhancement of displacement efficiency is limited. The displacement efficiency can be represented, for example, by displacement/driving voltage of the piezoelectric body. That is, a ratio of displacement in the piezoelectric body relative to the driving voltage is indicated. When the displacement of the piezoelectric body increases, the volume change of the ink chamber also increases. In the case of the device disclosed in Patent Document 1, when the height of the fine piezoelectric splits is increased, the volume change of the ink chamber is increased without raising the driving voltage.

However, since the displacement generated by the fine piezoelectric split is obstructed due to the structural limitation derived from the lid and insulating support substrate, it is supposedly difficult to increase the displacement per driving voltage.

A third problem is the drop of driving reliability with a demand for densification of the ink jet head in recent years. When a conductive liquid is used as an ink, it is indispensable to form the protector film in order to insulate the electrode. Furthermore, depending on a driving polarity, it is necessary to form the protector film in order to prevent electrolysis of the ink regardless of whether or not the ink has conductivity. A manufacturing method is not concretely described in Patent Document 1. However, when sputtering, chemical vapor deposition (CVD) or the like is used as means for forming the protector film, it would become difficult to form a unified, continuous, and highly reliable protector film because of surface tension of the material of the protector film with the narrowing the width of ink chambers and dummy chambers formed between the fine piezoelectric splits. This is because the narrower the spaces between them would result in the formation of closed spaces if the narrower the interval between the fine piezoelectric splits is made in order to raise the density. Then, problems such as short-circuit of the electrode are easily caused, and the driving reliability is lowered. For the forming of the electrode, because of the surface tension of the material of the protector film, it is difficult to form the uniform, homogeneous and highly reliable protector film for a similar reason, and there is possibility that conductive defect of the electrode is caused and the driving reliability is also lowered.

A fourth problem is a drop of a mounting property because of the demand for the densification with respect to the ink jet head in recent years. More concretely, the mounting property denotes a positioning precision or certainty during the connecting or bonding of a driving circuit or a power supply circuit to the ink jet head. Even when the ink jet head itself is capable of enhancing the discharge power and arranging the ink chambers or the piezoelectric devices in a high density and enhancing resolution, printing speed and the like, it is difficult to secure the high reliability over a long time if the mounting property is deteriorated.

The first to fourth problems of the ink jet head according to Patent Document 1 is also applicable to the ink jet (recording) head according to Patent Document 2 in consideration of the resolution and printing speed required for the printing apparatus in recent years. Needless to say, the ink jet head described in Patent Document 2 is supposed to be improved in the crosstalk (first problem) and displacement efficiency (second problem), compared with the ink jet head disclosed in Patent Document 1. This is because the lid includes the slit extending through the nozzle plate above the dummy chamber, the depth of the dummy chamber is larger than that of the ink chamber, and the dummy chamber is deep to such an extent that the slip deformation of the bottom part of the dummy chamber is not caused by the deformation of the piezoelectric body side walls constituting the ink chamber. However, the grooves are formed in the piezoelectric body substrate to constitute the ink and dummy chambers, and the piezoelectric body side walls which are basically displacement generating portions are connected to each other via the bottom part. Therefore, in the embodiment in which the arrangement density is enhanced to enhance the resolution and a plurality of piezoelectric body side walls are disposed in the vicinity of one another, effects of the reduction of the crosstalk and the enhancement of the displacement efficiency do not supposedly have a satisfactory level. It is noted that in case of the ink jet head according to Patent Document 2, the third and fourth problems are supposed to be remained unsolved since there is no mentioning as to these problems therein.

SUMMARY OF THE INVENTION

The present invention has been completed in consideration of the above-described problems of the related arts, and therefore, the present invention provides an ink jet head capable of attaining at least any one or preferably all of the reduction in crosstalk, enhancement of displacement efficiency, enhancement of driving reliability, and enhancement of mounting property in order to satisfy demands for resolution of the image or characters, printing speed and the like that have been required by a printing apparatus in recent years. As a result of studies, it has been found that the following piezoelectric actuator can be used as an ink jet head capable of solving the above-mentioned problems.

The present invention also provides a new method of manufacturing a piezoelectric actuator in which the piezoelectric actuator capable of solving the above-mentioned problems can be prepared with a higher yield by simpler manufacturing steps intended for enhancement of throughput. This would be attained by the following method of manufacturing the piezoelectric actuator.

That is, according to the present invention, there is provided a cell driving type piezoelectric actuator comprising: a plurality of cell driving bodies each comprising a wall portion, a cell formed by the wall portion, a piezoelectric body formed on at least one of wall portions and at least one pair of electrodes formed on the piezoelectric body; said piezoelectric operation portion being capable of changing a volume of the cell on which said piezoelectric operation portion is formed by its displacement, wherein the piezoelectric actuator comprises at least one pair of support bodies, the plurality of cell driving bodies are formed completely independent of one another and are connected to one another through at least one pair of support bodies, and the cell driving bodies and the support bodies are integrally formed by firing a green body of said piezoelectric actuator.

For the sake of description of the constitution, the terms "cell driving body" and "support body" are used independently in the present specification, however, they constitute a part of the present cell driving type piezoelectric actuator. This is because they become respectively a part of the present actuator after firing a green body comprised an assembled body of required parts for integration thereof. Moreover, the expressions "at least one pair of electrodes" and "at least one pair of support bodies" are used to mean that not only two or more pairs are used, but also they may be used in an odd number. For example, a certain electrode may form a pair of the electrodes with one electrode out of the other pair of electrodes when three electrodes are provided. A similar thing is also applicable to the support bodies. Furthermore, in the present specification, the piezoelectric operation portion basically means a construction comprising one piezoelectric body and a pair of the electrodes. Thus, it may be also called as piezoelectric device.

The cell driving type piezoelectric actuator according to the present invention is referred as to be piezoelectric. The actuator uses strain induced by an electric field, and is not limited to the piezoelectric actuator using a piezoelectric effect which generates a strain substantially proportional to the applied electric field in a narrow sense. The present actuator may include an apparatus using phenomena such as an electrostrictive effect of generating a strain substantially in proportion to a square of the applied electric field, polarization reverse seen in a general ferroelectric material, and antiferroelectric phase-ferroelectric phase transition seen in an antiferroelectric material. In the present cell driving type piezoelectric actuator, a ceramic actuator superior in material strength is more preferable. It is appropriately determined whether or not to perform a process concerning polarization based on properties of the material for use in the piezoelectric body of the piezoelectric operation portion constituting the present piezoelectric actuator.

In the cell driving type piezoelectric actuator according to the present invention, the expression "a plurality of cell driving bodies completely independent of one another" means that all the wall portions defining the respective cells and including at least the piezoelectric operation portion are independent of one another among a plurality of cell driving bodies each being formed of the wall portions defining the cell. This means that the piezoelectric operation portion for deforming the wall portions defining a cell is completely independent of the piezoelectric operation portion for the other cell. For example, in the ink jet head described in Patent Document 1, the wall portions (fine piezoelectric splits) defining the adjacent cells (channels) are bonded to each other with one sheet of a lid and one sheet (or plate) of an insulating support substrate. Moreover, in the ink jet (recording) head described in Patent Document 2, the wall portions (side walls) defining the adjacent cells (channels) are bonded to each other with the piezoelectric substrate. In this case, there have not heretofore been the piezoelectric actuator (ink jet head) in which all the wall portions defining the respective cells are completely independent each other.

In the cell driving type piezoelectric actuator according to the present invention, the shape of the cell driving body, that is, the shape of the cell formed by the wall portions is not limited, and a square rod shape, cylindrical shape and the like are usable. A more preferable shape of the cell is a square rod shape having a small width relative to the height, that is, a slit shape, as is discussed below in detail.

For a preferable first embodiment of the cell driving type piezoelectric actuator according to the present invention, each of the plurality of cell driving bodies is composed of a cell having a slit shape defined by two side walls and a ceiling wall and a bottom wall; each of the ceiling wall and bottom wall being connected to the two side walls, respectively, and a piezoelectric operation portion formed on each of two sides of the wall portion and comprising a laminated piezoelectric body and at least one pair of electrodes which are alternately laminated in a height direction of the side wall. Said actuator shows the displacement caused by a piezoelectric vertical effect.

The number of laminated layers for piezoelectric bodies is not limited, and one or a plurality of laminar bodies may also be laminated. One layer of a piezoelectric body and one pair of electrodes being formed by sandwiching said piezoelectric body is a minimum constitutional unit of the present piezoelectric operation portion. However, in order to enhance the displacement efficiency, the piezoelectric body is preferable thinner and composed of a multi-laminar piezoelectric film. The piezoelectric body for the first embodiment of the present invention is often referred to as a laminar piezoelectric body, however, this expression is used to distinguish the piezoelectric body of the first embodiment from the laminar piezoelectric body used as a preferable one in the second embodiment. Indeed, the use of the term "layered" or "laminar" is not intended to restrict the thickness of the piezoelectric body to a certain range in any means. The height direction of the side wall is used to show a relative direction, especially in contrast to the width direction of the side walls used in the preferable second embodiment, and the term "height" or "width" is used to show merely the relative direction, respectively. That is, the term "height direction" does not necessarily show the direction opposite to the gravity direction.

In the present specification, the slit-shaped cell means that, among the constituting elements of the wall portion defining the cell, two side walls are comparatively long, and the ceiling wall and bottom wall are comparatively short. The term "wall portion" is used together with the adjective expression, "side", "ceiling", or "bottom", however, this adjective expression does not mean the absolute direction or the positional relation. That is, the wall portion positioned at the gravity direction is not necessarily called as a bottom wall. Moreover, the expression "each piezoelectric operation portion disposed on the individual side wall" is often used in the present specification, and therefore the piezoelectric operation portion may be disposed on a part of the side wall, but the whole side wall may preferably constitute the piezoelectric operation portion. Furthermore, in the present specification, a preferable electrode is not limited, but is a thin film electrode.

In the first embodiment, although not restricted thereto, the end portions of said at least one pair of electrodes are embedded in the piezoelectric body at least when the electrodes are provided in the internal side of the cell. Further in this embodiment, although not restricted thereto, the end portions of said at least one pair of electrodes are preferably exposed from the piezoelectric body when the electrodes are provided on the external side of the cell.

The expression "end portions of the electrode embedded in the piezoelectric body when the electrodes are provided in the internal side of the cell" means that the end portions of the electrodes are not exposed from the piezoelectric body in the internal side of the cell, and that a state in which the end portions of the electrodes are not recognized when the internal side of the cell is observed with a naked eye. In the present specification, the word "cell" means a space formed by the wall portions including the piezoelectric body formed thereon, and which is a substantial portion. The expression "the internal side of the cell" means the side of the wall portion defining the cell referred to. The expression "the external side of the cell" means the side facing to the space present between the cell referred to and its adjacent cell.

Moreover, in the preferable second embodiment of the cell driving type piezoelectric actuator according to the present invention, each of the plurality of cell driving bodies constitutes the wall portion by two side walls, and a ceiling wall and a bottom wall connected to the two side walls to form the cell having a slit shape, and the piezoelectric operation portion disposed in each of at least two wall portions comprises the laminar piezoelectric body and at least one pair of electrodes formed on the side surface of the piezoelectric body to cause the displacement by a piezoelectric transverse effect.

The number of laminar piezoelectric bodies per wall portion is not limited, and one or a plurality of bodies may also be disposed. The minimum constitution of the piezoelectric operation portion includes one pair of electrodes formed on the opposite side surfaces of one piezoelectric body. When a plurality of piezoelectric bodies are disposed, the bodies are laminated in the width direction of the side wall, and the electrodes are also formed on the surfaces among the plurality of piezoelectric bodies. As described above, the term "the laminar piezoelectric body" is used, however, the use of this term does not automatically mean that the thickness of the piezoelectric body should be limited to a level within a certain range.

In the second embodiment, although not restricted thereto, a plurality of piezoelectric bodies is preferably disposed. This is because the displacement efficiency of the actuator is enhanced when this constitution is employed. In the case of the embodiment wherein a plurality of piezoelectric bodies is disposed, the present actuator has such a constitution that piezoelectric bodies and at least one pair of electrodes are alternately laminated in the width direction of the side wall. This is because the electrodes are formed on the side surface of a piezoelectric body and also on the face between the piezoelectric bodies.

Furthermore, in a preferable third embodiment of the present cell driving type piezoelectric actuator according to this embodiment, the actuator comprises a plurality of cell driving bodies wherein a wall portion is composed of two side walls, a ceiling wall and a bottom wall both of which are connected to the two side walls, respectively to form a cell having a slit shape, and a plurality of the piezoelectric operation portions being provided on three or all of the two side walls, the ceiling wall, and the bottom wall. It is to be noted that the third embodiment may sometimes be used in a combination of the first or second embodiment, or both embodiments.

In the third embodiment, one may provide, as one of the sub-embodiments, an actuator wherein all of the two side walls, ceiling wall, and bottom wall have piezoelectric operation portions formed on each of the walls. This can be attained since the plurality of cell driving bodies wherein the respective cells are defined by the respective wall portions are mutually completely independent of one another in the cell driving type piezoelectric actuator according to the present invention. As described above, in the ink jet head described in Patent Document 1 or the ink jet (recording) head described in Patent Document 2, the wall portions forming the adjacent cells are connected to one another in certain forms, and it is therefore difficult to provide a piezoelectric operation portion that is the displacement generating portion on the position where the wall portions are connected each other. However, in the cell driving type piezoelectric actuator according to the present invention, the whole wall portion defining the cell, that is, all of two side walls, ceiling wall, and bottom wall are mutually independent of one another among the plurality of cell driving bodies, and each wall portion is capable of generating the displacement (can be driven), and therefore it is possible to realize a sub-embodiment in which the piezoelectric operation portions are provided individually on all of the walls.

In the cell driving type piezoelectric actuator according to the present invention, the preferable shape of the cell is the slit shape. As described above, the term slit shape denotes in the present specification a shape defined by two side walls that are comparatively long and the ceiling and bottom walls that are short among the constituting elements of the wall portion defining the cell. More concretely, a ratio of the shortest length of the side walls to the shortest distance between the bottom wall and the ceiling wall wherein said walls forms forming a cell is preferable approximately 1:2 to 1:50. The ratio is sometimes referred to as the aspect ratio of the cell, and the shortest length of the side walls is sometimes referred to as a cell width, and the shortest distance between the bottom wall and the ceiling wall is sometimes referred to as a cell height. The cell width is preferably approximately 60 μm or less. More preferably, the aspect ratio of the cell is 1:10 to 1:30, and the cell width is 50 μm or less. If an actuator can satisfy at least any one of the above-mentioned requirements, preferably both of them, in other words, in the case of an actuator having a cell driving body being thin and/or tall, one may easily have an actuator having a higher output, and a high integration, thereby it is possible to have a highly compact actuator.

Moreover, in the cell driving type piezoelectric actuator according to the present invention, the ratio of the distance (hereinafter referred to as the cell interval) between the cells adjacent to each other to the cell height is preferably approximately 1:2 to 1:50, and the cell interval is preferably approximately 60 μm or less. More preferably, the ratio of the cell interval to the cell height is 1:10 to 1:25, and the cell interval is 50 μm or less. The distance between the cells adjacent to each other corresponds to a distance between the cell driving bodies. Therefore, if an actuator can satisfy at least any one of the above-mentioned two requirements, preferably both of them, although each cell driving body is completely independent of the other adjacent cell driving body, one may obtain an actuator having a numerous number of the cell driving bodies. Thus, it is possible to have a more compact actuator.

According to the present invention, there are provided the three embodiments for the manufacturing method of the present actuator. In a first embodiment of the manufacturing method for a cell driving type piezoelectric actuator according to the present invention, an actuator comprising a plurality of cells defined by a wall portion is manufactured. The wall portion comprises a wall portion being composed of two side walls, and a ceiling wall and a bottom wall wherein both of the ceiling wall and the bottom wall are connected to the two side walls, respectively, and piezoelectric operation portions being formed respectively on at least the two side walls; each of the piezoelectric operation portions having a laminar piezoelectric body and at least one pair of electrodes formed on the side face(s) of each piezoelectric body, and the piezoelectric operation portions being capable of causing a displacement by a piezoelectric transverse effect. The method comprises the steps of preparing three or more ceramic green sheets containing a piezoelectric material as a major component; forming at least two via holes or through holes in each of the three or more ceramic green sheets to obtain a plurality of processed ceramic green sheets A; forming a plurality of cavities on each of the plurality of processed ceramic green sheets A, and forming thereon a conductor film to be exposed to a face on which a plurality of cavities was formed to obtain a plurality of processed ceramic green sheets B; said conductor film being connected to lead wires for electrodes through the via hole or the through hole; laminating and compression-bonding a predetermined number of processed ceramic green sheets B to form a ceramic green laminated body having a plurality of through holes being connected through with the plurality of cavities having been formed in the predetermined number of processed ceramic green sheets B; firing thus laminated ceramic green laminated body to integrate the body, whereby a fired and integrated laminated body is produced.

The expression "the face from which a conductor film is exposed" is a face which contacts the cavity disposed in a processed ceramic green sheet B having a certain thickness (a sheet after the cavity is formed on the sheet A), and it is equal to a face of the processed ceramic green sheet B in the thickness direction. When a predetermined number of processed ceramic green sheets B are laminated, resultantly the through hole is formed on the face on which the cavity is formed. Since a predetermined number of cavities is formed, a predetermined number of through holes is disposed. The through hole is a space used for forming a cell at later stage or a space present between each pair of the adjacent cells. The expression "to form two via holes (or through holes)" means to form a via hole for a positive electrode and one for a negative electrode, respectively. The expression "to form at least three via holes (or through holes)" means that each of two via holes or through holes among three or more holes is used for a positive electrode of each of piezoelectric operation portions, and the remaining one is used for a commonly usable negative electrode, when a plurality of piezoelectric operation portions are disposed to generate the displacement individually. For example, in the cell driving type piezoelectric actuator including six piezoelectric operation portions, seven via holes (1+6=7) are preferably formed. When a plurality of piezoelectric operation portions are disposed in the wall portion constituting an individual cell, one via hole for the positive electrode may also be disposed for each cell in addition to the common via hole for the negative electrode. For example, the cell driving type piezoelectric actuator including three cells may represent a sub-embodiment in which four via holes (1+3=4) are formed.

It is to be noted that the ceramic green laminated body formed by laminating and compression-bonding a plurality of processed ceramic green sheets B may constitute two side wall portions including the piezoelectric operation portions in the cell driving type piezoelectric actuator. The ceiling wall and the bottom wall may be prepared independently. That is, in the first embodiment of a manufacturing method for a cell driving type piezoelectric actuator according to the present invention, any means or any process may be used as far as such a means or process may produce a ceiling wall and a bottom wall usable for the present actuator. For example, sheets corresponding to the ceiling wall and the bottom wall are separately prepared, and are combined with and laminated on and fired to integrate a plurality of processed ceramic green sheets B, with keeping the sheets as a most outer layer. Accordingly, it is possible to manufacture the actuator including the cell constituted by the ceiling wall and bottom wall connected to two side walls. The sheets corresponding to the ceiling and bottom walls may contain piezoelectric materials as a major component, but may also be formed of another material, when the piezoelectric operation portion is not necessarily provided in the ceiling wall and bottom wall.

The first embodiment of manufacturing method of a cell driving type piezoelectric actuator according to the present invention is preferable means as a method for manufacturing a cell driving type piezoelectric actuator according to the present invention. The method is not means useful only in a case where the cell driving type piezoelectric actuator of the present invention is prepared, and is also useful as means for preparing a piezoelectric actuator other than the cell driving type piezoelectric actuator of the present invention, including a plurality of cells and including an embodiment in which the wall portions forming the plurality of cells are not independent of one another. The embodiment in which the wall portions forming the plurality of cells are not independent of one another is, for example, an embodiment in which the ceiling wall or bottom wall is shared as the lid or the substrate by a plurality of cells, and corresponds to the ink jet head described in Patent Document 1 or the ink jet (recording) head described in Patent Document 2. On the other hand, it is possible to manufacture a cell driving type piezoelectric actuator according to the present invention by a method other than the first embodiment of manufacturing method of a cell driving type piezoelectric actuator according to the present invention, for example, by means for separately preparing and bonding and firing/integrating the cell driving body and one pair of support bodies.

A second embodiment of a method for manufacturing a cell driving type piezoelectric actuator according to the present invention is an embodiment of a method for manufacturing a preferable first embodiment of the cell driving type piezoelectric actuator according to the present invention. The method comprises the steps of: preparing two side walls of a ceramic material containing a piezoelectric material as a major component and a ceiling wall or a bottom wall, forming one or two or more micro-channels in the ceiling wall or the bottom wall, assembling thus prepared members to form the cell; and subsequently introducing a fluid of an insulator material into each of the cell portions through the respective micro-channels to bring the insulator material into close contact with a face of the wall portion defining the cell to form a protector film on the cell forming surface.

A third embodiment of a method for manufacturing a cell driving type piezoelectric actuator according to the present invention is a method of manufacturing a preferable second embodiment of the cell driving type piezoelectric actuator according to the present invention. The method comprises the steps of: preparing two side walls of a ceramic material containing a piezoelectric material as a major component and a ceiling wall or a bottom wall, and forming one or two or more micro-channels in the ceiling wall or the bottom wall to form the cell, assembling thus prepared members to form the cell; and subsequently introducing a fluid of a conductor material or an insulator material into each of the cells through the respective micro-channels and bringing the conductor material or the insulator material into close contact with a face of the wall portion to form an electrode or a protector film for insulating the electrode on the cell forming surface. It is to be noted that in the present specification, the term "cell forming surface" means the surface of the wall portion defining the cell which is the space.

In the second and third embodiments of a method for manufacturing a cell driving type piezoelectric actuator according to the present invention, there is no restriction as to the means or process for forming micro-channels on a ceiling wall and a bottom wall of the wall portion. That is, as far as the micro-channels can be formed in the ceiling wall and the bottom wall of the wall portion, any means or process may be employable. The micro-channels may be formed before introducing a fluid of a conductor or an insulator material into the cell. There is no restriction in the means for introducing the insulator material (or the conductor material). Thus, a conductor material may be fed into the cell through the respective micro-channels in the form of a liquid or a gas. Therefore, one may employ a plating method, CVD method, or the like for the application of the insulator material (or the conductor material).

The second and third embodiments for a method for manufacturing a cell driving type piezoelectric actuator according to the present invention are both preferable methods for manufacturing a cell driving type piezoelectric actuator according to the present invention, but the cell driving type piezoelectric actuator according to the present invention may also be prepared by a method different from the second and third embodiments of a method for manufacturing a cell driving type piezoelectric actuator according to the present invention. For example, the present actuator may also be manufactured by means of separately preparing two side walls including the piezoelectric operation portions, coating at least the cell forming surface with the insulator material to form the protector films on these independent side walls, subsequently assembling the cell driving body together with the separately prepared ceiling and bottom walls, bonding thus obtained cell driving body to one pair of support bodies separately prepared, and firing to integrate the bodies.

The first and second embodiments of a method for manufacturing a cell driving type piezoelectric actuator according to the present invention, or the first and third embodiments of the present manufacturing method are usable independently of one another. However, to prepare the cell driving type piezoelectric actuator, the first, second, or third manufacturing method of the cell driving type piezoelectric actuator according to the present invention is usable in combination. The characteristic feature of the first embodiment of a method for manufacturing a cell driving type piezoelectric actuator according to the present invention lies in the preparation of wiring with a green sheet lamination method. However, there is no limitation as to the means or the process for forming the electrodes or protector film. On the other hand, the characteristic feature of the second and third embodiments of a method for manufacturing a cell driving type piezoelectric actuator according to the present invention lies in the preparation manner of the electrode or the protector film, and the preparation of the cell driving body and support bodies that can be formed by employing a green sheet lamination method. However, there is no limitation as far as the means or the process for preparing wiring is concerned.

In the cell driving type piezoelectric actuator according to the present invention, since a plurality of cell driving bodies wherein the respective cells are formed by the wall portion are completely independent of one another, a plural number of cell driving bodies is discontinued each other at at least a part of the wall portion on which the piezoelectric operation portion is formed. Thus, the interference of the deformation formed in the wall portion of one cell caused by the displacement generated by its piezoelectric operation portion over the other cell(s) is reduced to a great extent, compared with the conventional ones. Furthermore, the problem of the crosstalk hardly occurs.

Moreover, as is mentioned above, since a plurality of cell driving bodies wherein the respective cells are formed by the wall portion are completely independent of one another, a plural number of cell driving bodies is discontinued each other at at least a part of the wall portion on which the piezoelectric operation portion is formed. Therefore, the displacement generated by the piezoelectric operation portion in one cell is hardly interfered by the other cell(s), and the cell shows a larger displacement, compared with the conventional ones. This displacement is nearly equal to that of a bulk body at a prescribed driving voltage. Furthermore, since dead end spaces are not formed among the plurality of cell driving bodies as in the conventional dummy chamber (dummy channel), a material for forming electrodes or a protector film hardly remains in such dead spaces during the formation step of the electrodes or the film. Therefore, a superior driving reliability in the case of the present actuator is attained because the electrodes and/or the protector film formed on the outer faces of the respective cells is improved in the uniformity and the homogeneity. Furthermore, since the other parts such as jigs can be installed by protruding them through the intervals between a plurality of cell driving bodies, the holding and/or positioning of the cell driving bodies are easily attained. Furthermore, one may mount with a great easiness the present actuator onto the other members and/or parts.

In the cell driving type piezoelectric actuator according to the present invention, as a preferable sub-embodiment of the third embodiment, one may employ a embodiment wherein the piezoelectric operation portions for the respective cell driving bodies are provided on any three combination out of two side walls, a ceiling wall, and a bottom wall or all of them. This is because each of cells having a slit shape is formed by an individual wall portion being composed of two side walls, a ceiling wall, and a bottom wall. As a result, a larger change in the cell volume is attained at the prescribed driving voltage, and this make it possible to further enhance the displacement efficiency of the present actuator.

In case of one preferable sub-embodiment for the first embodiment of the cell driving type piezoelectric actuator according to the present invention, each piezoelectric operation portion for the actuator includes a laminar piezoelectric body and at least one pair of electrodes both of which are alternately laminated in the height direction of the side wall, thereby the displacement is generated by the piezoelectric vertical effect. Therefore, the strain based on the piezoelectric effect is directly usable, the generation force of displacement is large, and the response rate is fast. Therefore, effects in the reduction of crosstalk and the enhancement of displacement efficiency are large.

Moreover, in case of a further preferable sub-embodiment of the first embodiment, at least the end portion of each electrode for each cell driving body is embedded in the inside face of the cell constituting the piezoelectric body. Therefore, any type of fluids can be used in principle since the surface of the piezoelectric body that the fluid to be charged into the cell contacts is usually made of chemically remarkably stable ceramic. Furthermore, since the electrode does not contact the fluid charged in the cell during the manufacturing the present actuator, it is not necessary to form the protector film for insulating the electrode regardless of the type of the fluid to be used. This would reduce largely the number of the manufacturing steps. When one employs an embodiment wherein the end portion of each electrode for each cell driving body is embedded no so as to appear both in the internal face and in the outer face of the cell, and no common electrode or wiring is formed on the side wall of the piezoelectric body, one may connect a plurality of cell driving bodies one another through the support bodies in a higher density without lowering the reliability in conductivity of the electrode.

The preferable sub-embodiment of the second embodiment of the cell driving type piezoelectric actuator according to the present invention is an embodiment in which the piezoelectric operation portion includes a laminar piezoelectric body and at least one pair of electrodes formed on the side surfaces of the piezoelectric body, and the displacement is generated by the piezoelectric transverse effect. In a further preferable sub-embodiment in the second embodiment, a plurality of laminar piezoelectric bodies in each cell driving body are disposed, and the respective laminar piezoelectric bodies thereof are laminated in the width direction of the side wall with sandwiching the respective laminar piezoelectric bodies between the respective electrodes therefor. According to this sub-embodiment, one may make the piezoelectric body thinner. Thus, one may attain a larger displacement and higher generation force at the prescribed driving voltage. When the laminar piezoelectric bodies are laminated to form a plywood-like member, the mechanical strength of the actuator can be enhanced. Therefore, the piezoelectric actuator having a higher durability is attained. Note that the cell driving type piezoelectric actuator according to the present invention is not restricted to the first and second embodiments, and that a cell driving type piezoelectric actuator using a share mode wherein the displacement is caused by applying the driving voltage in a direction crossing a polarized electric field direction of the piezoelectric body at right angle may also be used.

In the first embodiment of a method for manufacturing a cell driving type piezoelectric actuator according to the present invention, the green sheet lamination method may be used. One may form a via hole or a through hole, and a conductor film to be connected with the electrodes through the via hole or the through hole and to be exposed to each cavity forming surface on each sheet in which the predetermined number of the cavities has been formed before laminating the sheets. If one employs this embodiment, one may complete wiring process of an actuator by forming the electrodes only on the side face of the through hole to be communicated with the electrodes through the respective cavities of the ceramic green laminated body or the fired laminated body obtained by laminating the respective sheets. This obviates a necessity for performing a laborious wiring operation after obtaining the fired laminated body, and the simplification of the manufacturing method can be achieved. Since the electrode(s) formed on the side face of the through hole are connected to the via hole through a plurality of conductor films formed on each sheet, the driving reliability is enhanced without causing the conductive defect. The electrode(s) formed on the side surface of the through hole is connected to the via hole through the conductor film of each sheet, and connected to even the via hole appearing on the surface of the fired laminated body. A terminal electrode can be disposed so as to be connected to the via hole if necessary, and it is easy to connect the piezoelectric actuator to other devices or apparatuses such as a power supply.

The second and third embodiments of a method for manufacturing a cell driving type piezoelectric actuator according to the present invention include the steps of: preparing a plurality of the cells each of which is a closed space except that the micro-channels are formed at one end; introducing a fluid of a conductor material and/or an insulator material through the micro-channels; bringing the conductor material and/or the insulator material into close contact with the cell forming surface of the wall portion; and forming electrodes on the cell forming surface. Indeed, only an insulator material is used in the case of the second embodiment of the present method. After forming the cell that may be deemed as a substantially closed space, the electrode(s) or the protector film can be formed on the cell forming surface. Therefore, in the case of the second and third embodiments, one does not need the step of forming the electrode(s) or the protector film in the step of laminating the sheets like the green sheet lamination method employed in the first embodiment for a manufacturing method. Accordingly, the troublesome manufacturing step can be omitted in the second and third embodiments. The unification and the continuity of the electrode(s) and/or the protector film are enhanced, and the actuator superior in driving reliability is obtained. Especially, in the third embodiment of a manufacturing method according to the present invention, that is, in a case where the preferable second embodiment of the cell driving type piezoelectric actuator according to the present invention is prepared, the electrode(s) may also be formed on the whole cell forming surface of the wall portion. Therefore, masking or lithography patterning (photoresist) for eliminating the electrode formation is not required, and the simplification of the manufacturing step is attained.

BRIEF DESCRIPTION OF THE DRAWINGS

FIGS. 6(a) to 6(e) are diagrams schematically showing still another example of the process of the method of manufacturing the cell driving type piezoelectric actuator according to the present invention;

FIG. 8 is a diagram showing one embodiment of the cell driving type piezoelectric actuator according to the present invention, and is an enlarged cross-sectional view in a case where the cell driving type piezoelectric actuator shown in FIG. 1 is cut;

DESCRIPTION OF THE PREFERRED EMBODIMENT

Figure 1:
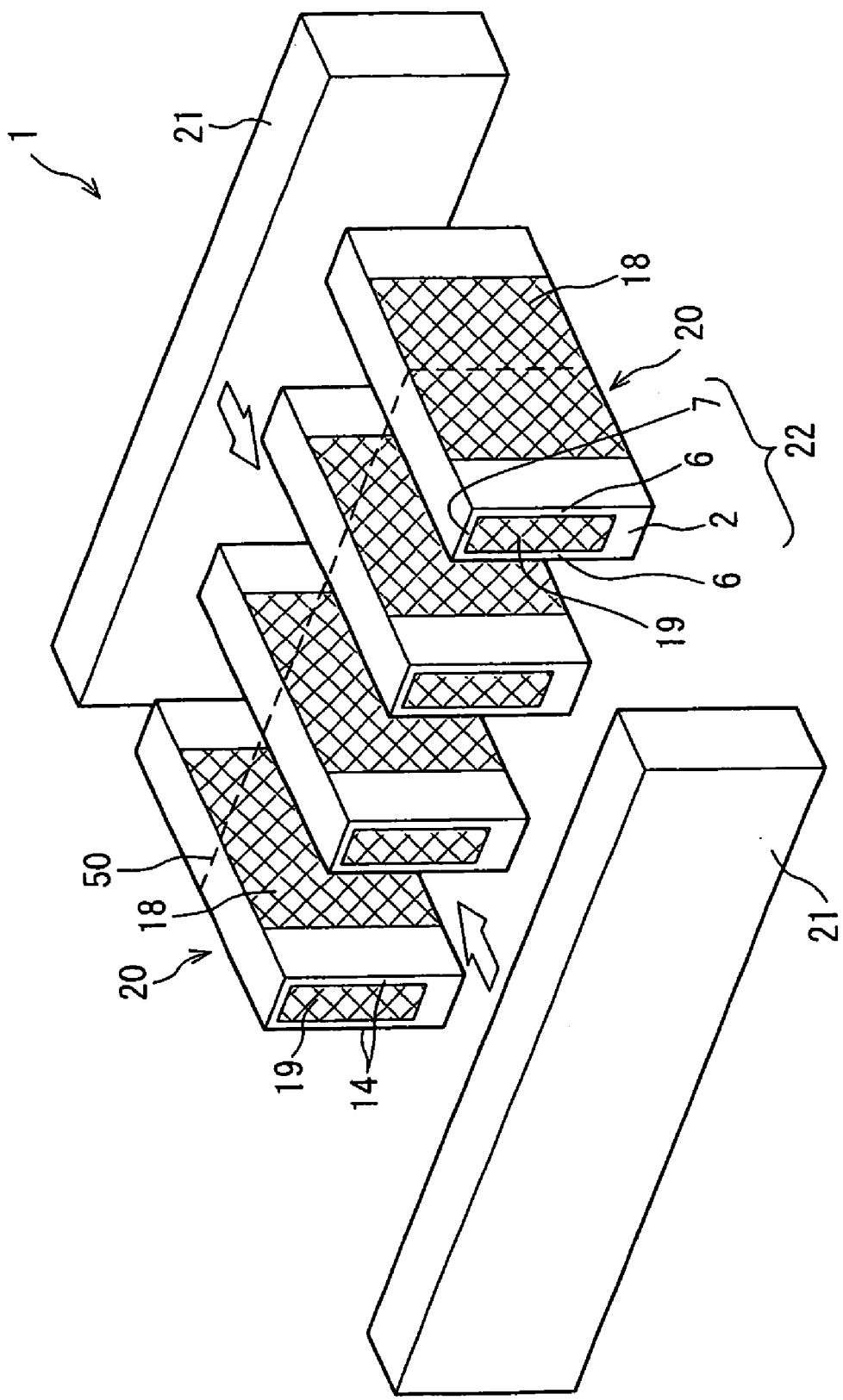
FIG. 1 is a diagram showing one embodiment of a cell driving type piezoelectric actuator according to the present invention, and is an illustrative showing wherein each of constitutional elements of the present cell driving type piezoelectric actuator 1 is shown in a divided state for ease of understanding the structure.

Embodiments of a cell driving type piezoelectric actuator of the present invention, and a method for manufacturing a cell driving type piezoelectric actuator according to the present invention will be described hereinafter appropriately with reference to the drawings, but the present invention is not interpreted, with limiting to these embodiments. Various changes, modifications, improvement, or replacements may be made based on knowledge of a person skilled in the art without departing from the sprit of the present invention. For example, the accompanying drawings show preferable embodiments of the present invention, therefore, the present invention is not limited to embodiments or information shown in the drawings. In implementing or verifying the present invention, means similar or equivalent to the means described in the present specification is applicable. Indeed, the means described hereinafter shows a preferable means.

FIGS. 1 and 8 are diagrams showing one embodiment of a cell driving type piezoelectric actuator according to the present invention. FIG. 1 is an illustrative showing wherein each of constitutional elements of the present cell driving type piezoelectric actuator 1 is shown in a divided state for ease of understanding the structure. FIG. 8 is a slightly enlarged sectional view in a case where the cell driving type piezoelectric actuator 1 shown in FIG. 1 is cut along a cut line 50.

A cell driving type piezoelectric actuator 1 shown in the accompanying figures includes four cell driving bodies 20 and one pair of support bodies 21 which are constituting elements, and four cell driving bodies are completely independent of one another, and are connected to one another via one pair of extending support bodies 21. However, the numbers of the respective parts, portions, members and the like referred to in the above are given only for an illustration purpose, therefore, the present actuator is not limited to those having the above-mentioned constitution in any means. In FIG. 1, the cell driving bodies 20 and support bodies 21 are shown being separated, but in the cell driving type piezoelectric actuator 1, the cell driving bodies 20 and support bodies 21 are integrated to form the actuator as a whole by firing. Each of the cell driving bodies 20 includes a wall portion 22, and a cell 3 formed by the wall portion 22. The wall portion 22 comprises two side walls 6, a ceiling wall 7, and a bottom wall 2, and the cell 3 has an elongated slit-shaped section.

The cell driving type piezoelectric actuator 1 according to the present invention is an actuator comprising a plurality of piezoelectric operation portions 4; each of said plurality of piezoelectric operation portions being composed of a laminar piezoelectric body 14, and one pair of electrodes 18, 19 being formed on two side walls 6 of the cell driving body 20 in such a manner that the laminar piezoelectric body 14 is sandwiched between the electrodes 18 and 19: and said actuator capable of changing the volume of the cell 3 caused by the displacement generated by the piezoelectric operation portion 4 based on a piezoelectric transverse effect thereof. Note that "the piezoelectric operation portion 4 in the present actuator" does not necessarily mean that the whole portion of the side wall is formed as a piezoelectric operation portion. That is, in case of the cell driving type piezoelectric actuator 1 shown in FIG. 3, the piezoelectric operation portion 4 is equal to the whole portion of the side wall 6. However, the piezoelectric operation portion 4 (54) only shares a part of the side wall 6 in case of the cell driving type piezoelectric actuator 1 shown in FIG. 5.

The present actuator can be used as an ink jet head, if an ink supply port and a nozzle (not depicted) are disposed so as to make them communicate with the cell 3 in the cell driving type piezoelectric actuator 1 in the same manner as the actuators disclosed in Patent Documents 1 or 2. When an electric field for driving is applied to the side wall 6 including the piezoelectric operation portions 4 of a cell 3 in the same direction as an electric field direction for polarization, the side wall contracts/expands in a vertical direction, that is, in the height direction of the side wall shown in FIG. 8, thereby the volume of the cell 3 is changed, and an ink charged in the cell 3 is discharged.

In the present cell driving type piezoelectric actuator 1, as can be clearly taken from FIG. 8, all the wall portions 22 defining the respective cells 3 and including the respective side walls 6 constituting the respective piezoelectric operation portions 4 are not connected to one another at at least a part of the wall portion 22 (side wall 6) wherein the respective piezoelectric operation portions 4 are formed, among four cell driving bodies 20, and are completely independent of one another. Since the piezoelectric operation portions 4 formed on the side walls 6 (wall portion 22) which define a cell 3 of one cell driving body 20 is constituted like mentioned above, the deformation of the side walls 6 generated by the displacement of the piezoelectric operation portions 4 which causes the deformation of the side walls hardly interferes the movement of the wall portions 22 defining the cell 3 of adjacent cell driving bodies 20. Furthermore, a problem of crosstalk in the present actuator is largely reduced, compared with the conventional one. Moreover, the displacements generated by the piezoelectric operation portions 4 are not mutually easily obstructed among the plurality of cell driving bodies 20, and the displacement that can be generated per driving voltage is large as compared with the related art.

As a typical embodiment for the present cell driving body 20 of the cell driving type piezoelectric actuator 1, one may take up an actuator in which a piezoelectric operation portion 4 disposed in a side wall 6 comprises a laminar piezoelectric body 14 and one pair of electrodes 18, 19 formed on the side surfaces of the piezoelectric operation portion 4, thereby the displacement occurs as a result of the piezoelectric transverse effect, however, one may use any type of modified cell driving bodies in the present cell driving type piezoelectric actuator, as far as it can work without disturbing the intended effects of the present actuator.

Other examples of the cell driving bodies whose sections are shown in FIGS. 9 to 12 will be described hereinafter. These cell driving bodies are practically similar to the above-mentioned cell driving body 20 in that each of these cell driving bodies comprises a wall portion being composed of two side walls, a ceiling wall and a bottom wall, and a cell formed by the wall portion and having an elongated slit section. Moreover, for cell driving bodies 90, 100 shown in FIGS. 9, 10, in the same manner as in the above-mentioned cell driving body 20, the piezoelectric operation portion disposed on the side wall comprises a laminar piezoelectric body and one pair of electrodes formed on the side surfaces of the piezoelectric body, and it generates the displacement by the piezoelectric transverse effect. On the other hand, cell driving bodies 110, 130 shown in FIGS. 11, 12, the piezoelectric operation portion disposed on the side wall comprises a laminar piezoelectric body and one pair of electrodes, which are alternately laminated in the height direction of the side wall, and it generates the displacement by the piezoelectric vertical effect.

The cell driving body 90 is different from the above-mentioned cell driving body 20 in that the piezoelectric operation portions 4 are disposed on all the constituents of the wall portion, that is, the ceiling wall 7 and bottom wall 2 in addition to two side walls 6. Since all the constituents of the wall portion are deformable, the driving voltage is set to be constant. Accordingly, the volume of the cell in this embodiment can be largely changed, and the displacement efficiency is further enhanced. In this embodiment of the cell driving body, the ceiling wall 7 and bottom wall 2 may be lengthened to form a cell having a square rod shape whose section is almost square, not a slit-shaped cell.

The cell driving body 100 is different from the cell driving body 20 in that there are two layers of laminar piezoelectric bodies 14 constituting two side walls 6 and the two layers of laminar piezoelectric bodies 14 are laminated in a width direction (transverse direction in FIG. 10) of the side wall 6; each of said layer being sandwiched between the electrodes 18, 19 to form a piezoelectric operation portion 24. As compared with the cell driving body being equal in the thickness (width) of the side wall 6, one layer of laminar piezoelectric body 14 becomes thinner, and a larger displacement and higher generation force can be developed even at a constant driving voltage. Since the plywood-like side walls 6 are constituted as shown in those figures, the mechanical strength is enhanced, and durability is improved.

In the cell driving body 110, a piezoelectric operation portion 34 is provided on each of two side walls 6. The piezoelectric operation portion 34 comprises a laminar piezoelectric body 114 and electrodes 28, 29 being alternately laminated on the side wall 6 in the height direction thereof, thereby the displacement is generated by the piezoelectric vertical effect. Nine layers of laminar piezoelectric bodies 114 are disposed in the side wall 6 (see FIG. 11), and ten layers (nine pairs) in total of electrodes 28, 29 having different polarities are laminated alternately with sandwiching a sheet of a laminar piezoelectric body 114 therebetween. Further in the cell driving body 110, the piezoelectric operation portion 34 is also disposed in the ceiling wall 7, and the piezoelectric operation portion 34 in the ceiling wall 7 comprises two layers of laminar piezoelectric bodies 114 and three layers (two pairs) of electrodes 28, 29 which are alternately laminated in the length direction (transverse direction in FIG. 11), thereby the displacement is generated by the piezoelectric vertical effect.

When the driving field is applied to the piezoelectric operation portion 34 in the same direction as the polarized field direction in this type of the actuator mentioned in the above paragraph, the piezoelectric operation portion provided on the side wall 6 contracts/expands in the height direction (vertical direction in FIG. 11), and the one provided on the ceiling wall contracts/expands in the length direction (transverse direction in FIG. 11), thereby the volume of the cell 3 is changed. Since three out of four wall portions are deformable, the volume of the cell can be more largely changed at the driving voltage set at a constant level. In this embodiment of the cell driving body, at least the ceiling wall 7 may be made long to constitute the cell having the square rod shape whose section is almost the square, not the slit-shaped cell.

In the cell driving body 130, two side walls 6 are provided with piezoelectric operation portions 44, respectively, and the piezoelectric operation portion 44 comprises the laminar piezoelectric body 114 and electrodes 28, 29 alternately laminated in the height direction of the side wall 6, thereby the displacement is generated by the piezoelectric vertical effect. When the electric field for driving is applied to the piezoelectric operation portion 44 in the same direction as the electric field direction for polarization, the piezoelectric operation portion contracts/expands in the height direction (vertical direction in FIG. 12) of the side wall 6, thereby the volume of the cell 3 is changed.

The cell driving body 130 is different from the cell driving body 110 in that the end portions of the electrodes 28, 29 of the piezoelectric operation portion 44 disposed on the side wall 6 are embedded in the piezoelectric body 114 both at the internal side and the external side of the cell 3. For the cell driving body 130, the electrode is not apparently exposed to the face of the side wall 6. Therefore, when the cell driving body 130 is disposed between the support bodies in a high density, short-circuit of the electrode does not occur. The electrode is not exposed to the surface (cell forming surface) forming the cell 3 of the side wall 6 (wall portion 22), and the cell forming surface is constituted of the laminar piezoelectric body 114 which is usually chemically remarkably stable. For example, with the use as an ink jet head, any type of ink materials are usable in principle, and it is unnecessary to form the protector film for insulating the electrode(s) regardless of the kind of the ink material to be used. Note that the electrodes 28, 29 may also be exposed from the piezoelectric body 114 provided on the external side of the cell 3 in the same manner as in an example described later (see FIG. 7(a)). In this case, a portion for generating the displacement is enlarged, and the displacement efficiency is enhanced.

For the cell driving body 130, nine layers (in the drawing) of piezoelectric bodies 114 are disposed and ten layers (nine pairs) in total of the electrodes 28, 29 having different polarities are laminated with sandwiching the piezoelectric body 114 therebetween in the same manner as in the cell driving body 110 on the side wall 6. One may freely choose the number of layers to be laminated, taking the application and/or the purpose into consideration in the case that the piezoelectric operation portion causes the displacement based on the piezoelectric vertical effect as in the piezoelectric operation portions 34, 44. In consideration of stability of actuator characteristics and easiness of manufacturing, a preferable number of layers of piezoelectric bodies is two to 100 layers. For the displacement of the piezoelectric body, since a field inductive strain is directly used, the generation force is large, and the response is quick. The displacement developed by one layer of piezoelectric body is not large, but is proportional to the number of sets each including the piezoelectric bodies and one pair of film electrodes, and therefore it is possible to obtain a large displacement by the increase of the number of layers. Moreover, when the thickness of one layer of piezoelectric body is set to preferably 100 μm or less, more preferably 10 to 80 μm, it is possible to drive the piezoelectric body at a lower voltage.

The cell driving type piezoelectric actuator has been described above. Next, a method for manufacturing a cell driving type piezoelectric actuator according to the present invention will be described in detail. It is to be noted that in the present specification, a manufacturing method of a cell driving type piezoelectric actuator according to the present invention includes the first, the second, and the third embodiments of a method for manufacturing a cell driving type piezoelectric actuator according to the present invention, and these embodiments will also be referred to simply as the first manufacturing method, the second manufacturing method, and the third manufacturing method, respectively. Unless mentioned specifically, the term "method" means any one of these three embodiments. Also in the present specification, the term "ceramic green sheet" will be sometimes referred to simply as the sheet.

The cell driving type piezoelectric actuator according to the present invention can be manufactured by the process in which the cell driving body and the support body extending over the body are separately prepared, bonded to each other, and fired to integrate them totally. However, this method has difficulties in handling of the cell driving body before assembly, positioning of the cell driving body and the support body. Thus, this method is inferior in productivity. Therefore, it is preferable to use the ceramic green sheet lamination method wherein the cell driving body is integrated with the support body before the firing when the cell driving type piezoelectric actuator according to the present invention is manufactured. The first manufacturing method of the cell driving type piezoelectric actuator according to the present invention meets this preferable condition.

Figure 2A:
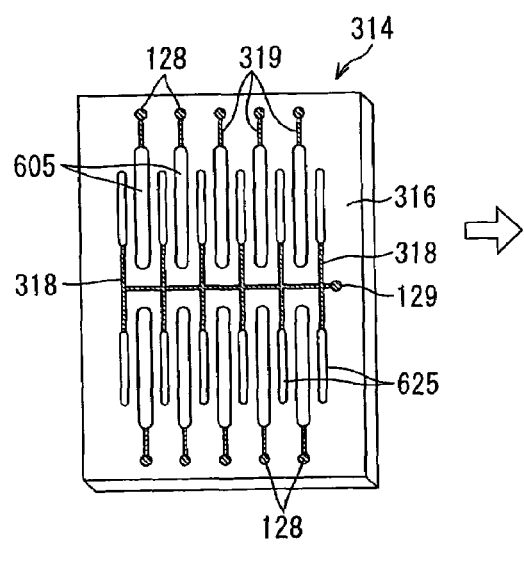
FIGS. 2(a) to 2(c) are diagrams schematically showing one example of a process of a method of manufacturing a cell driving type piezoelectric actuator according to the present invention.
Figure 2B:
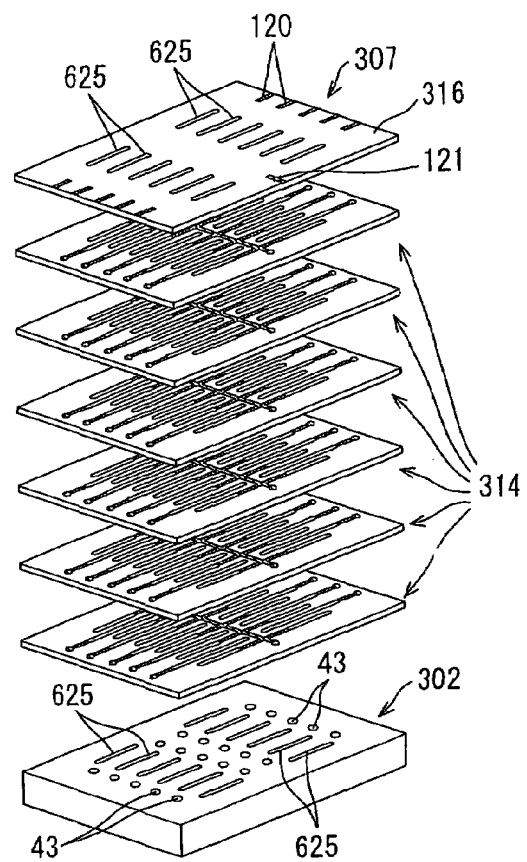
Figure 2C:
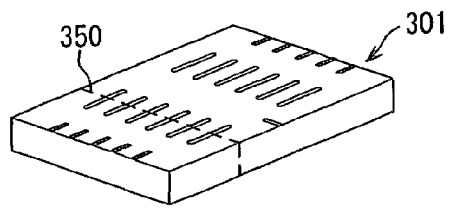
Figure 3:
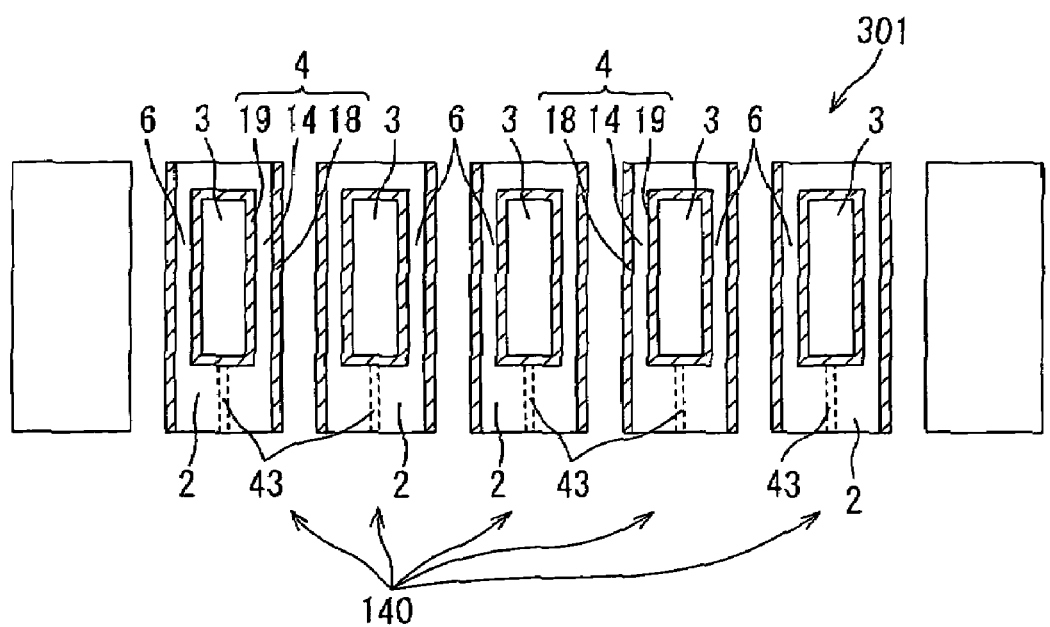
FIG. 3 is a cross-sectional view in a case where the cell driving type piezoelectric actuator shown in FIG. 2(c) is cut.

One example of schematic steps of the method of manufacturing a cell driving type piezoelectric actuator according to the present invention is shown in FIGS. 2(a), 2(b), and 2(c). A preparation object is a cell driving type piezoelectric actuator 301 whose section is shown in FIG. 3. FIG. 3 is a cross-sectional view in a case where the cell driving type piezoelectric actuator 301 shown in a perspective view of FIG. 2(c) is cut along a cut line 350. For the cell driving type piezoelectric actuator 301 shown in FIGS. 2(c) and 3, each cell driving body 140 includes the piezoelectric operation portion 4 on the side wall 6 in the same manner as in the cell driving type piezoelectric actuator 1 described above. The piezoelectric operation portion 4 for this actuator comprises a laminar piezoelectric body 14 and one pair of electrodes 18, 19 formed on the side surface of the piezoelectric body 14, thereby the displacement is generated by the piezoelectric transverse effect. This actuator has a bottom wall having micro-channels 43. The cell driving type piezoelectric actuator 301 includes three (two pairs of) support bodies, and two rows of five continuously arranged cells 3 (cell driving bodies 140) per row extended over the support bodies are disposed. Thus, this actuator has ten cells 3, i.e., ten cell driving bodies 140 per unit.

The respective manufacturing steps for the first manufacturing method will be described hereinafter with reference to FIGS. 2(a), 2(b), 2(c), and 3. First, a predetermined number of ceramic green sheets 316 containing a piezoelectric material as a major component are prepared. The ceramic green sheets can be prepared by a ceramic manufacturing method which has heretofore been known. For example, a piezoelectric material powder is prepared, and a binder, a solvent, a dispersant, a plasticizer or the like is mixed into the piezoelectric material so as to have a desired composition to prepare a slurry. After defoaming treatment of the slurry, it is possible to form the sheet by sheet molding methods such as a doctor blade method, a reverse roll coater method, a reverse doctor roll coater method, and the like.

Subsequently, as shown in FIG. 2(a), ten via holes 128 equal to the number of the cells to be formed for individual wiring and one via hole 129 for a common wiring are formed in the six sheets 316. This step is a step for forming a green sheet A in the first manufacturing method. However, no via holes are formed on one sheet to be used for constituting the bottom wall later.

Next, a plurality of cavities 605, 625 are formed in each of six sheets out of the remaining sheets 316 in which the via holes 128, 129 have been formed conductor films 318, 319 (films formed of the conductor material) exposed to the surfaces and connected to the via holes 128, 129 are formed on the surfaces wherein a plurality of cavities 605, 625 have been formed to obtain the sheets 314. This step is a step for forming a green sheet B in the first manufacturing method.

In the sheet 314, ten cavities which are a hole for constituting a cell at later stage are disposed at the rate of five cavities per row, and these cavities are relatively largely opened, compared with the cavities 625. A cavity 625 is a hole for constituting not the cell but the space between two adjacent cells at later stage, and two rows each of six cavities are disposed and opened. Sheet solid portions between the cavities 605, 625 are laminated later to form the side wall. The conductor films 319 are used in individual wirings, and are exposed to the surface in which the cavities 605 for constituting the cells at later stage are formed. The conductor films 318 will be used for the common wiring, and exposed to the surface in which the cavities 625 for constituting the space at later stage as mentioned above are formed. It is to be noted that the conductor films can be formed in predetermined patterns by methods such as screen printing. It is possible to form the cavities, for example, by punching by using a punch and die.

A sheet 316 in which the via holes 128, 129 have been formed is chosen as a sheet 307 for constituting the ceiling wall later, and a plurality of cavities 625, and terminal electrodes 120, 121 to be connected to the via holes 128, 129 are formed thereon (see FIG. 2(b)). A sheet 316 in which the via holes 128, 129 have not been formed are chosen as a sheet 302 for constituting a bottom wall later, and two micro-channels are per cavity; that is, 20 micro-channels 43 are formed in total per sheet. Two micro-channels 43 are disposed in a position communicating with the cavity 605 of the sheet 314, when the sheet 302 is laminated on the sheet 314. It is to be noted that in FIG. 2(b), the sheet 302 is depicted as a thick one, however, there is no limitation in the thickness. That is, the thickness thereof may be equal to that of the sheet 307 or 314. This is also applicable even to other manufacturing methods described later.

Next, thus prepared sheets 302, 307 and 314 are laminated with using the sheets 302 and 307 as an outermost layer, respectively, and thus laminated body is compression-bonded to obtain a ceramic green laminated body (not shown). The obtained ceramic green laminated body has a plurality of through holes formed by a plurality of cavities 605 communicating with one another and formed in each of the six sheets 314.

Thereafter, the compression-bonded ceramic green laminated body is fired and integrated to obtain a fired laminated body (not shown). In the fired laminated body, the through holes formed by the cavities 605 of the sheets 314 communicating with one another form the cells 3 after firing, ten cells in two rows are disposed in total since five cells 3 are formed per row, and two rows are provided per actuator (see FIG. 2(b) showing a state before the laminating and FIG. 3). Each row of the cells 3 corresponds to the cell driving body 140, and both external sides of each row of the cells 3 and the portion between the two rows correspond to the support body.

Next, a fluid of a conductor material is introduced into thus formed cells 3 through the micro-channels 43 formed in the portion corresponding to the sheet 302, the conductor material is brought into close contact with the surface forming the cell 3 (cell forming surface) (third manufacturing method), and drying and firing are performed if necessary to form the electrodes 18, 19 (see FIG. 3). Similarly, a liquid of an insulator material is introduced into the cells 3 through the micro-channels 43, the insulator material is brought into close contact with the electrodes 18, 19 (third manufacturing method), the drying and firing are performed if necessary to form the protector film, and polarization is performed if necessary to obtain the cell driving type piezoelectric actuator 301 (see FIG. 2(c)).

Figure 4A:
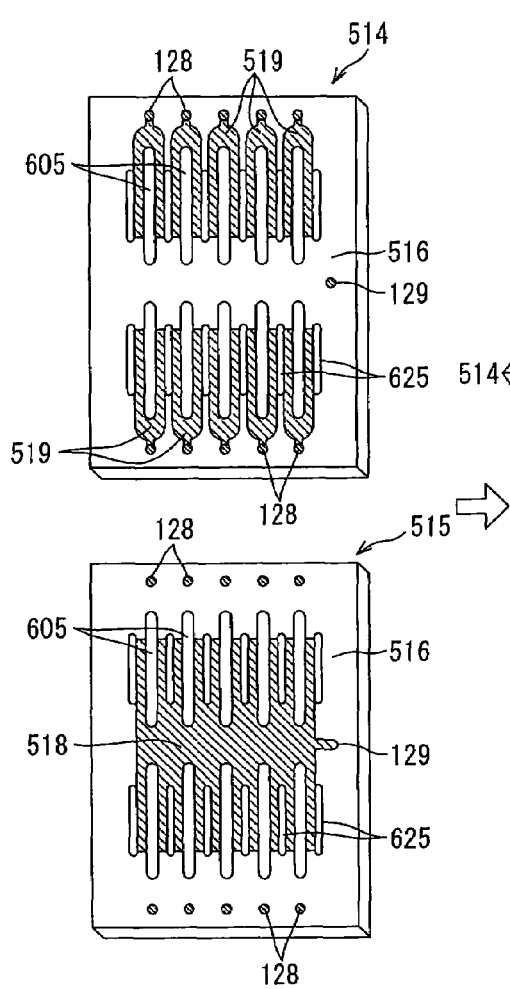
FIGS. 4(a) to 4(c) are diagrams schematically showing another example of the process of a method of manufacturing a cell driving type piezoelectric actuator according to the present invention.
Figure 4B:
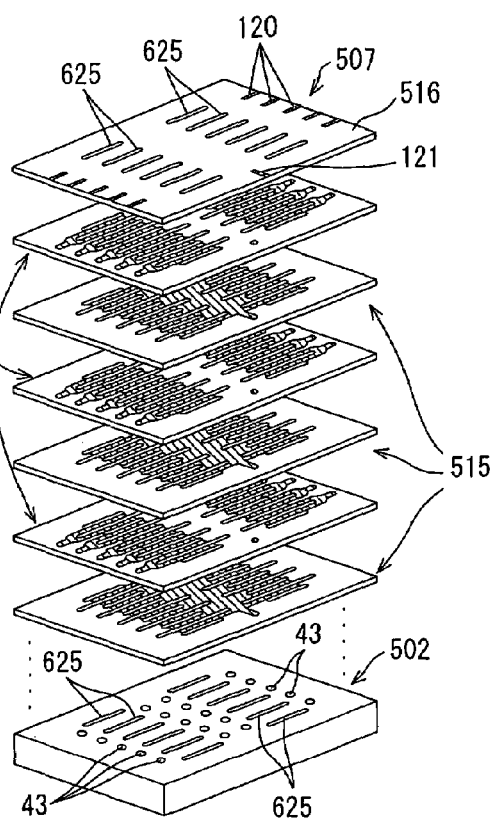
Figure 4C:
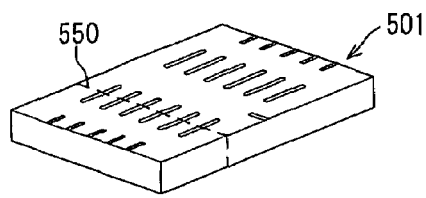
Figure 5A:
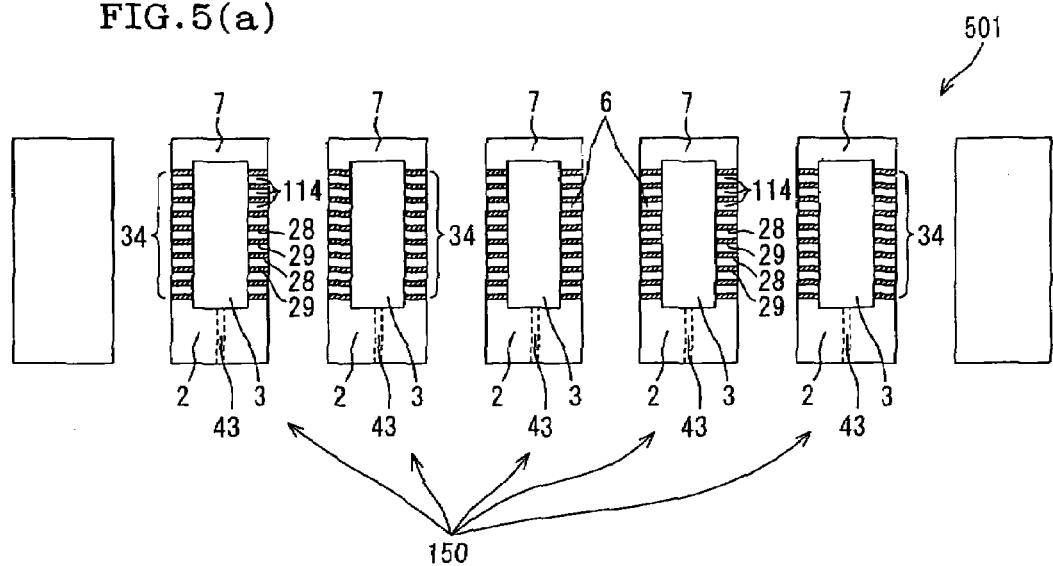
FIGS. 5(a) and (b) are cross-sectional views in a case where the cell driving type piezoelectric actuator shown in FIG. 4(c) is cut.
Figure 5B:
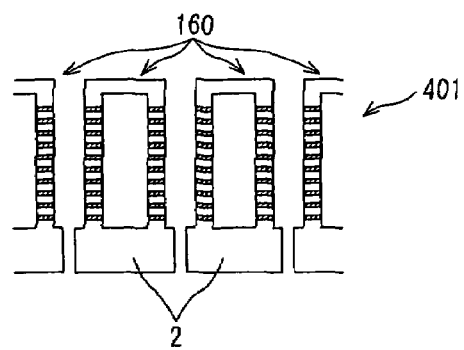

Another example of the method for manufacturing a cell driving type piezoelectric actuator according to the present invention will hereinafter be described. FIGS. 4(a), 4(b), and 4(c) schematically show the steps. The preparation object is a cell driving type piezoelectric actuator 501 whose section is shown in FIG. 5(a). FIG. 5(a) is a sectional view in a case where the cell driving type piezoelectric actuator 501 obtained in the steps described below as shown in a perspective view of FIG. 4(c) is cut along a cut line 550. In the case of the cell driving type piezoelectric actuator 501 shown in FIGS. 4(c) and 5(a), each cell driving body 150 comprises a piezoelectric operation portion 34 provided on each of two side walls 6 in the same manner as in the cell driving type piezoelectric actuator 110 described above, and a bottom wall 2 having micro-channels 43. The piezoelectric operation portion 34 comprises a plurality of laminar piezoelectric bodies 114 and electrodes 28, 29 that are alternately laminated in the height direction of the side wall 6, thereby the displacement is generated by the piezoelectric vertical effect. The cell driving type piezoelectric actuator 501 includes three (two pairs of) support bodies, and ten cells 3 (cell driving bodies 150) in total in two rows continuously arranged with extending over the support bodies; each row containing five cells 3, like the cell driving type piezoelectric actuator 301.

The manufacturing steps will be described hereinafter with reference to FIGS. 4(a), 4(b), 4(c), and 5(a). First, in a similar manner as done in the method described above, a predetermined number of ceramic green sheets 516 containing a piezoelectric material as a major component are prepared. Then, as shown in FIG. 4(a), ten via holes 128 for the individual wirings, which are equal to the number of cells to be formed, and one via hole 129 for the common wiring are formed in the necessary number of sheets 516.

Next, a plurality of cavities 605, 625 are formed respectively in five sheets which are the half of ten sheets conductor films 519 (films formed of the conductor material) having predetermined patterns to be connected to the via holes 128 are formed to obtain the sheets 514 (see FIG. 4(a)). Further in the other five sheets, the plurality of cavities 605, 625 are formed thereon, and conductor films 518 having the predetermined patterns to be connected to the via holes 129 are also formed thereon to obtain sheets 515.

In the sheets 514, 515, ten cavities 605 which are a hole for constituting a cell at a later stage are formed with arranging them in the form of two rows; five cavities per row. The cavities 605 are opened in a comparatively large size, compared with that of the cavities 625. The cavity 625 is a hole for constituting the space between the adjacent cells at later stage, but not being used as a cell. The cavities 625 are formed with aligning six each in two rows, in such a manner that each cavity 605 is sandwiched by the cavities 625. The sheet solid portions between the cavities 605 and 625 are laminated later to constitute the side wall. The conductor films 519 of the sheet 514 are formed so as to cover the sheet surface between the cavities 605 and 625, and a part of the films is used at later stage for the formation of electrodes 29 of the individual wirings. Those films may be used as an individual wiring. The conductor film 518 are formed on the sheet 515 in such a manner that the sheet surface between the cavities 605 and 625 is covered thereby, and a part of the film 518 is used at later stage for the formation of an electrode 28 for the common wiring. The film may be used as a common wirings.

A sheet 516 in which the via holes 128, 129 are formed is chosen to be used as a ceiling wall later. A plurality of cavities 625 are opened in this sheet, and the terminal electrodes 120, 121 to be connected to the via holes 128, 129 are formed to obtain one sheet 507 (see FIG. 4(b)). A sheet 516 in which the via holes 128, 129 are not formed is prepared to be used as a bottom wall later. A plurality of cavities 625 are opened in this sheet 516, and 20 micro-channels 43 are formed in a rate of two micro-channels per cell to obtain a sheet 502. The 20 micro-channels 43 are formed at such a position that the two micro-channels each can communicate with each of the cavities 605 formed in the sheets 514, and 515, when the sheet 502 is laminated with the sheets 514, and 515.

Next, the sheets 502, 514, 515, 507 are laminated and compression-bonded in such a manner that the sheets 514 and 515 are alternately laminated while keeping the sheets 502, and 507 as an outermost layer respectively at either end to obtain the ceramic green laminated body (not shown). It is to be noted that only a partial number of the sheets 514, 515 are shown in FIG. 4(b). Thus obtained ceramic green laminated body has a plurality of through holes, as a result of laminating alternately each of five sheets 514, and five sheets 515, so as to make the respective plurality of cavities 605 formed each sheet communicate each other.

Additionally, it is preferable to form a bonding-assistant layer on a green sheet, or between the green sheets to improve the lamination condition of the green sheets, i.e., the unification of the laminated body. Furthermore, one may form a bonding-assistant layer on the surface of the conductor film to flatten the unevenness of the surface of the green sheet on which a conductor film is formed. This is because, more or less, the surface becomes uneven, dependent upon the patterns of the conductor film(s) formed thereon. The unevenness can be flattened by forming the bonding-assistant layer, however, the flattening of the unevenness of the surface can be preferably achieved by subjecting the sheet to compression treatment by using a pressing machine or the like prior to the lamination, then thus flattened sheet is stacked with other green sheets to form a ceramic green laminated body, and the resultant laminated body is compression-bonded. More preferably, one may use jointly the formation of the bonding-assistant layer and the flattening by the mechanical means.

Moreover, thus laminated ceramic green body is fired and integrated to obtain a fired laminated body (not shown). In the resulting fired laminated body, the through holes formed from the cavities 605 of the respective sheets 514, and 515 which communicate with each other become the cells 3. Ten cells in two rows are arranged as a total, since five cells 3 are disposed per row. Each row portion of the cells 3 corresponds to the cell driving body 150, and one external side of each row of the cells 3 and the portion between the two rows correspond to the support bodies.

Next, if a formation of a protector film is requisite, a liquid of an insulator material is introduced into the respective cells 3 through the micro-channels 43 formed in the corresponding portions of the respective sheets 502 after firing, and the insulator material is brought into close contact with the surface forming the cell 3, and then drying and firing if necessary are performed (second manufacturing method). Then, the polarization treatment may be performed, in case of need. Resultantly, a cell driving type piezoelectric actuator 501 according to the present invention may be obtained (see FIG. 4(c)). It is to be noted that a cell driving type piezoelectric actuator 401 in a embodiment including cell driving bodies 160 in which only the bottom walls 2 are protruded can be prepared by a similar manner as that shown in FIG. 5(b).

Figure 7A:
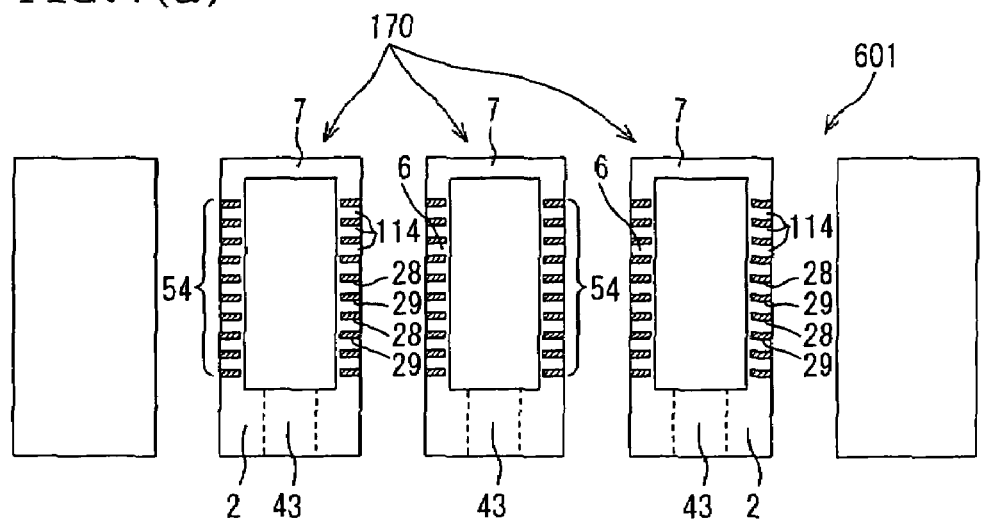
FIG. 7(a) is a cross-sectional view in a case where the cell driving type piezoelectric actuator shown in FIG. 6(e) is cut.

Still another example of the method for manufacturing a cell driving type piezoelectric actuator according to the present invention will hereinafter be described. FIGS. 6(a) to 6(e) schematically show the steps. The preparation object is a cell driving type piezoelectric actuator 601 whose section is shown in FIG. 7(a). FIG. 7(a) is a sectional view in a case where the cell driving type piezoelectric actuator 601 obtained in the steps described below as shown in a perspective view of FIG. 6(e) is cut along a cut line 750. For the cell driving type piezoelectric actuator 601 shown in FIGS. 6(e) and 7(a), each cell driving body 170 comprises a piezoelectric operation portion 54 formed on each of the two side walls 6. The piezoelectric operation portion 54 comprises a plurality of laminar piezoelectric bodies 114 and electrodes 28, 29 alternately both of which have been laminated in the height direction of the side wall 6, thereby the displacement is generated by the piezoelectric vertical effect. In case of an actuator produced by this embodiment, the micro-channels 43 are in the bottom wall 2. For the cell driving body 170 of the cell driving type piezoelectric actuator 601, the end portions of the electrodes 28, 29 are embedded in the piezoelectric body 114 if the electrode is formed in the internal side of the cell 3, thereby the electrodes 28, 29 are not exposed to the surface (cell forming surface) forming the cell 3 of the side wall 6. Therefore, the step of forming the protector film on the cell forming surface can be omitted in this method. The cell driving type piezoelectric actuator 601 is provided with two (one pair of) support bodies, and three cells 3 (cell driving bodies 170) bridging between two support bodies arranging in a row.

The manufacturing steps will be described hereinafter with reference to FIGS. 6(a) to 6(e) and 7(a). First, in a similar manner as that of the method described above, the predetermined number of ceramic green sheets 616 containing a piezoelectric material as a major component are prepared. Moreover, conductor films 619 (films formed of the conductor material) having the predetermined patters are formed in three sheets which are the half of six sheets (see FIG. 6(a)). The preparation of sheets for the ceiling wall and bottom wall will be described below. Furthermore, conductor films 618 having the predetermined patterns are formed in the other three sheets.

Next, as shown in FIG. 6(b), a sheet 607 to be used as a ceiling wall is prepared by opening a plurality of cavities 625 to be used for the space between the adjacent cells later in a sheet 616 on which a conductor film is not formed. A sheet 602 to be used as a bottom wall is prepared by forming similarly a plurality of cavities 625 to be used as the space between the adjacent cells later and a plurality of micro-channels 43 in a sheet 616 on which a conductor film is not formed. Two micro-channels 43 each are disposed in the position communicating with the cavities 605 of the sheet 614, 615, when the sheet 602 is laminated on the sheet 614, 615. Similarly, a plurality of cavities 605 which constitute the cells later and a plurality the cavities 625 which constitute the space between the adjacent cells later are opened in predetermined number of the sheets in which the conductor films 618 and 619 are formed beforehand to obtain the sheets 614, 615. The solid portions between the cavities 605 and 625 in the sheets 614, 615 constitute the side walls later.

In the case of the cell driving type piezoelectric actuator 601, the piezoelectric operation portion 54 on which a predetermined number of laminar piezoelectric bodies 114 and a predetermined number of the electrodes 28, 29 are alternately laminated, the end portions of the electrodes 28, 29 are embedded in the piezoelectric body 114. Therefore, in the step shown in FIG. 6(b), to obtain the sheets 614, 615, the cavities 605 should be opened in a position where the cavities contact the conductor films 618, 619. Needless to say, it is determined whether or not the cavities 605 contact the conductor films 618, 618 by the relative positional relation. Therefore, in the step shown in FIG. 6(a), the conductor films 618, 619 should also be formed apart from positions where the cavities 605 are opened later in that sense.

The conductor films 619 of the sheet 614 should be separated from the cavities 605 as described above, but is formed so as to cover the sheet surface between the cavities 605 and 625. A part of the films is used to constitute the electrodes 29 for the individual electrodes later, or it may be used for the individual wirings. The conductor film 618 of the sheet 615 should be similarly separated from the cavities 605, but is formed so as to cover the sheet surface between the cavities 605 and 625. A part of the films is used to constitute the electrodes 28 later as a common electrode, or it may be used as for common wirings.

Next, as shown in FIG. 6(c), the sheets 614, 615 are alternately laminated between the sheets 607 and 602, and compression-bonded to obtain a laminated ceramic green body having a predetermined thickness (not shown). Thus obtained ceramic green laminated body has a plurality of through holes coming from a plurality of cavities 605 by laminating three sheets 614, 615 each in a predetermined number so as to make the cavities communicate with each other. Next, the laminated ceramic green body is fired/integrated to obtain a fired laminated body 610. In the obtained fired laminated body 610, the through holes formed by the cavities 605 of the sheets 614, 615 communicating with one another become the cells 3 when fired. Three cells 3 are arranged in one row, the row portion of the cell 3 corresponds to the cell driving body 170, and each external side of the row of the cells 3 corresponds to the support body.

Figure 7B:
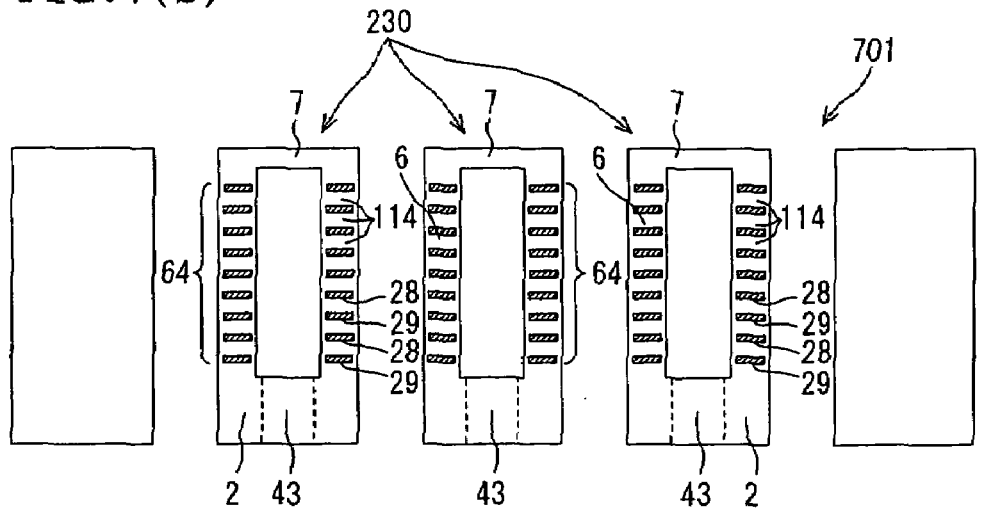
FIG. 7(b) is a sectional view showing one example of the cell driving type piezoelectric actuator according to the present invention.
Figure 9:
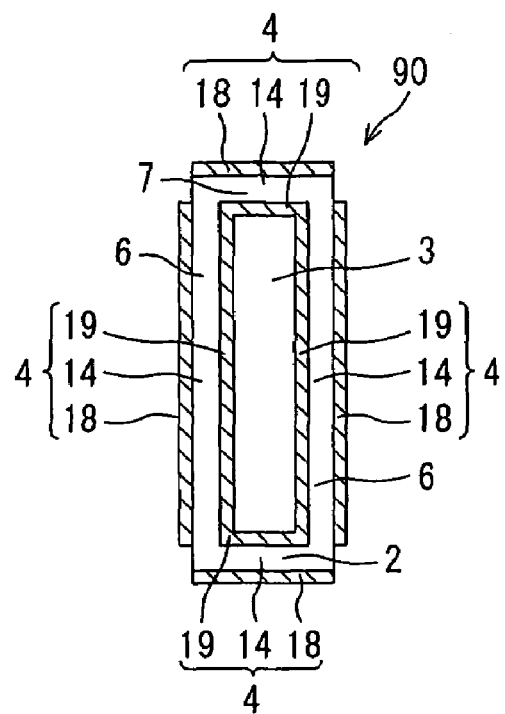
FIG. 9 is a cross-sectional view showing one example of a cell driving body disposed in the cell driving type piezoelectric actuator according to the present invention.
Figure 10:
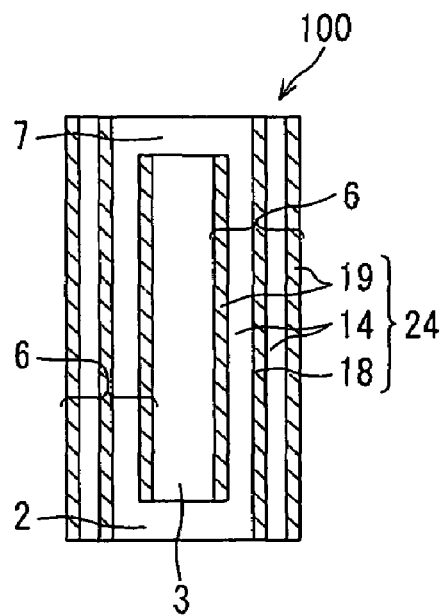
FIG. 10 is a cross-sectional view showing another example of the cell driving body disposed in the cell driving type piezoelectric actuator according to the present invention.
Figure 11:
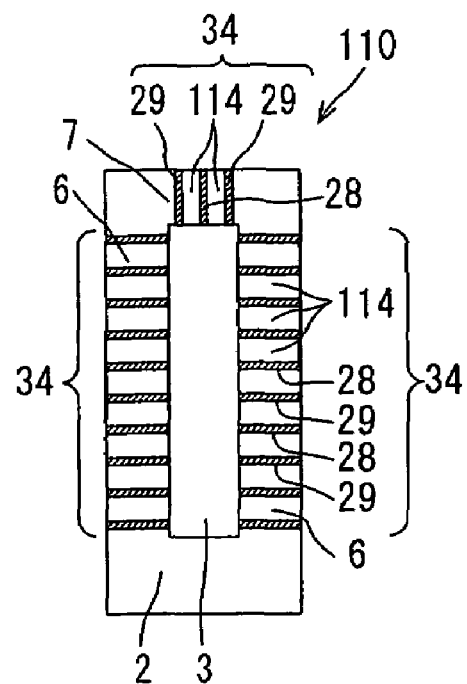
FIG. 11 is a cross-sectional view showing still another example of the cell driving body disposed in the cell driving type piezoelectric actuator according to the present invention.
Figure 12:
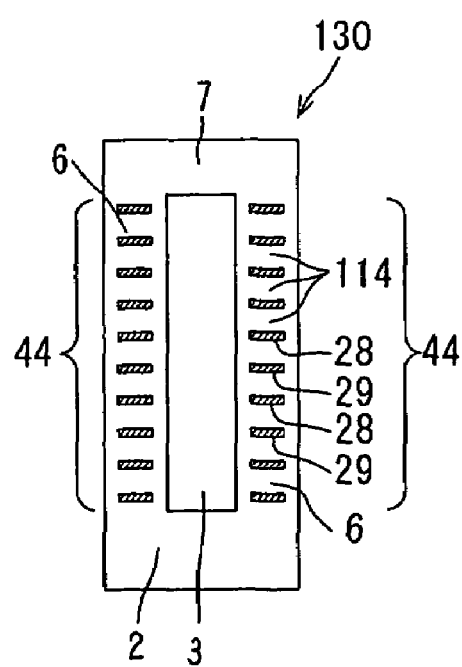
FIG. 12 is a cross-sectional view showing still another example of the cell driving body disposed in the cell driving type piezoelectric actuator according to the present invention.

Next, the fired laminated body 610 is cut along the cut line 650 by means such as wire saw working to remove unnecessary portions so that the electrodes formed by firing the conductor films 618, 619 formed in the sheets 614, 615 appear (FIG. 6(d)). Moreover, the terminal electrodes 120, 121 are formed and connected to the obtained electrodes on the upper and side surfaces of the fired laminated body 610. The terminal electrodes 120, 121 are connected in portions different from two side walls 6 constituted by the piezoelectric operation portion 54 (positions distant from the cavities 605 and 625 and the sheet solid portions between the cavities in the sheets 614, 615) every other layer. In other words, the electrodes formed by sintering the conductor films 618 are connected to each other, and the electrodes formed by sintering the conductor films 619 are connected to each other. Furthermore, the polarization may be performed if necessary. Finally, the cell driving type piezoelectric actuator 601 may be obtained. It is to be noted that it is possible to prepare a cell driving type piezoelectric actuator 701 shown in FIG. 7(b) by similar manner. The cell driving type piezoelectric actuator 701 is an embodiment of the present actuator wherein the end portions of the electrodes 28, 29 of piezoelectric operation portions 64 are embedded in the piezoelectric bodies 114 not only at the internal side of the cell 3 but also at the external side of the cell 3 (on the side facing to the space) in cell driving bodies 230.

Next, the explanation on piezoelectric material usable for the present cell driving type piezoelectric actuator will be made. Indeed, any kind of the piezoelectric materials may be usable for the formation of the present cell driving type piezoelectric actuator as far as it does not affect adversely on the performance thereof. That is, there are no particular requirements as far as the material causes strains induced by electric field for driving such as the piezoelectric effect or electrostrictive effect. The material may also be either crystalline or amorphous, or a semiconductor ceramic, ferroelectric ceramic, or antiferroelectric ceramic may also be used. The material may also be appropriately selected and use in accordance with the application. The material may require the polarization or not. Concrete example of preferable materials include a ceramic containing lead zirconate, lead titanate, lead magnesium niobate, lead nickel niobate, lead cobalt niobate, lead zinc niobate, lead manganese niobate, lead antimony stannate, lead manganese tungstate, lead magnesium tungstate, lead manganese tantalite, lead nickel titanate, barium titanate, sodium bismuth titanate, bismuth neodymium titanate (BNT), potassium sodium niobate, strontium bismuth tantalite, copper barium tungsnate, bismuth ferrate, or a complex oxide containing at least two kinds of those materials.

Furthermore, the piezoelectric material may be a piezoelectric material containing further therein at least an oxide selected from the group consisting of lanthanum, calcium, strontium, molybdenum, tungsten, barium, niobium, zinc, nickel, manganese, cerium, cadmium, chromium, cobalt, antimony, iron, yttrium, tantalum, lithium, bismuth, tin, copper and the like in the form of a solid solution. One may use a piezoelectric material which further contains lithium bismuthate, or lead germanate. That is, such a material is a piezoelectric/electrostrictive material comprising a complex oxide of lead zirconate, lead titanate and lead magnesium niobate, and lithium bismuthate or lead germanate as an additive. This complex oxide containing material may be preferably used for the formation of the present device since the material can show high material characteristics, while it can be fired at relatively lower temperature. A firing of the piezoelectric material at a relatively lower temperature can be also achieved by using a material prepared by adding a glass, such as for example, a silicate glass, a borate glass, a phosphate glass, a germanate glass or any mixture thereof to the piezoelectric material. The amount of the glass material to be added could be desirably chosen, depending upon the required performances of the device to be produced, since an excessive addition of the glass often causes the deterioration of the material characteristics of the device produced.

As the material of the electrode, in general, an electric conductor metal which is solid at room temperature is used. Examples include one of aluminum, titanium, chromium, iron, cobalt, nickel, copper, zinc, niobium, molybdenum, ruthenium, palladium, rhodium, silver, tin, tantalum, tungsten, iridium, platinum, gold, and lead, or an alloy of two or more of them, such as silver-platinum, silver-palladium and platinum-palladium. One material alone or a combination of two or more of the materials is preferably used. Alternatively, one may use a mixture between at least one of these materials mentioned above and any one of aluminum oxide, zirconium oxide, titanium oxide, silicon oxide, cerium oxide, glass, and piezoelectric material or a cermet thereof. These materials are preferably selected in accordance with the kind of the piezoelectric material.

Moreover, as the material of the protector film, silicon dioxide, silicon nitride, boric acid-phosphoric acid-silicic glass (BPSG), phosphoric acid-silicic glass (PSG) and the like are used.

A cell driving type piezoelectric actuator according to the present invention is applied as an ink jet head for a printing apparatus, and is additionally applicable as an actuator portion for a DNA chip manufacturing device, optical switch, micro-mirror, or micro-machine conveying device (for example, linear motors), as is described in WO 02/084751 filed by the present applicant. Furthermore, the present actuator may also be preferably used as the actuator portion for a micro-pump, coating device for manufacturing a semiconductor, complicated and fine three-dimensional structure preparing device, chemical synthesizing device in a pharmaceutical field, film forming device and the like.

What is claimed is:

1. A cell driving type piezoelectric actuator comprising:
    a plurality of cell driving bodies formed completely independent from one another, each comprising a wall portion forming a cell;
    a piezoelectric body formed on at least one of the wall portions;
    at least one pair of electrodes formed on the piezoelectric body;
    a piezoelectric operation portion comprising the piezoelectric body and the pair of electrodes, the piezoelectric operation portion being capable of changing a volume of the cell, on which said piezoelectric operation portion is formed by its displacement; and
    a single pair of support bodies connecting the plurality of cell driving bodies to one another,
    wherein the cell driving bodies and the support bodies are integrally formed by firing a green body of said piezoelectric actuator.

2. The cell driving type piezoelectric actuator according to claim 1, wherein each of the plurality of cell driving bodies comprises the wall portion being composed of two side walls, and a ceiling wall and a bottom wall; both ceiling and bottom walls being connected, respectively to the two side walls to form a cell having a slit shape, and wherein a piezoelectric operation portion disposed in each of at least two side walls comprises a laminar piezoelectric body and at least one pair of electrodes both of which are alternately laminated in a height direction of the side wall, thereby a displacement is caused by a piezoelectric vertical effect.

3. The cell driving type piezoelectric actuator according to claim 2, wherein an end portion of at least one pair of electrodes is embedded in the piezoelectric body at lease at an internal side of the cell.

4. The cell driving type piezoelectric actuator according to claim 3, wherein the end portion of at least one pair of electrodes is exposed from the piezoelectric body at an external side of the cell.

5. The cell driving type piezoelectric actuator according to claim 1, wherein each of a plurality of cell driving bodies comprises the wall portion being composed of two side walls, and a ceiling wall and a bottom wall; both ceiling and bottom walls being connected, respectively to the two side walls to form the cell having a slit shape, and wherein the piezoelectric operation portion disposed in each of at least two side walls comprises a laminar piezoelectric body and at least one pair of electrodes formed on a side surface of the piezoelectric body, thereby a displacement is caused by a piezoelectric transverse effect.

6. The cell driving type piezoelectric actuator according to claim 5, wherein a plurality of laminar piezoelectric bodies are provided.

7. The cell driving type piezoelectric actuator according to claim 1, wherein each of the plurality of cell driving bodies comprises the wall portion being composed of two side walls, and a ceiling wall and a bottom wall; both ceiling and bottom walls being connected, respectively to the two side walls to form the cell having a slit shape, and wherein the piezoelectric operation portion is composed of at least three of the two side walls, the ceiling wall, and the bottom wall.

8. A cell driving type piezoelectric actuator comprising:
    a plurality of cell driving bodies formed completely independent from one another, each comprising a wall portion comprising two side walls, a ceiling and a bottom wall, the ceiling and the bottom walls being connected to the two side walls to form a slit shaped cell;
    a piezoelectric body formed on at least one of the wall portions; and
    at least one pair of electrodes formed on the piezoelectric body;
    a piezoelectric operation portion comprising the piezoelectric body and the pair of electrodes, the piezoelectric operation portion being capable of changing a volume of the cell, on which said piezoelectric operation portion is formed, by its displacement; and
    at least one pair of support bodies connecting the plurality of cell driving bodies to one another,
    wherein the cell driving bodies and the support bodies are integrally formed by firing a green body of said piezoelectric actuator.

* * * * *